United States Patent [19]

Overman et al.

[11] 4,133,037

[45] Jan. 2, 1979

[54] SYSTEM AND METHOD OF PERFORMING A DECISIVE PHASE COHERENCE TEST

[75] Inventors: Kelly C. Overman; Thelma L. Calder, both of Pikesville, Md.

[73] Assignee: Westinghouse Electric Corp., Pittsburgh, Pa.

[21] Appl. No.: 817,758

[22] Filed: Jul. 21, 1977

Related U.S. Application Data

[63] Continuation of Ser. No. 658,010, Feb. 13, 1976, abandoned.

[51] Int. Cl.[2] .......................... G06F 15/20; H03B 3/04

[52] U.S. Cl. .................................... 364/484; 307/232; 324/83 D; 328/133

[58] Field of Search ........................ 235/151.3, 151.31; 307/232; 328/133; 324/83 R, 83 A, 83 D

[56] References Cited

U.S. PATENT DOCUMENTS

| | | | |
|---|---|---|---|
| 3,308,385 | 3/1967 | Piety et al. | 328/133 X |
| 3,521,084 | 7/1970 | Jones | 307/232 |
| 3,631,340 | 12/1971 | Miller | 324/83 A |
| 3,657,732 | 4/1972 | Krause | 328/133 X |
| 3,800,235 | 3/1974 | Carre et al. | 328/133 |
| 3,968,493 | 7/1976 | Last et al. | 324/83 D X |

*Primary Examiner*—Jerry Smith
*Attorney, Agent, or Firm*—W. E. Zitelli

[57] ABSTRACT

Apparatus for ascertaining the phase coherency of the pulse trains comprising signals in which the phase relationship of pulse trains of one signal sorted from a first dwell of pulses is compared with the phase relationship of the pulse trains of another signal sorted from a second dwell of pulses to determine the phase shift between the signals. At a substantially later time, the process is repeated to again establish the phase shift between the signals, and the two phase shifts are then compared. If the phase relationships are substantially identical, the signals are considered to be phase coherent.

13 Claims, 6 Drawing Figures

SYSTEM AND METHOD OF PERFORMING A DECISIVE PHASE COHERENCE TEST

CROSS REFERENCE TO RELATED APPLICATIONS

This application is a continuation of U.S. patent application Ser. No. 658,010; filed Feb. 13, 1976, now abandoned.

BACKGROUND OF THE INVENTION

1. Field of the Invention

The invention relates to apparatus for ascertaining phase coherency of signals.

2. Description of the Prior Art

Processing devices contained in signal processing systems, such as trackers and jammers contained in a radar system, commonly operate through a central processing unit to perform their various functions on signals detected by a receiver. In the course of their operation, these devices often require, as an input, the characterization of specified signals as to whether they are phase coherent. With the advent of signal processing systems which utilize digital techniques, a marked improvement in the level of performance of these processing devices has been made possible. However, these improved devices cannot perform at a higher level than the accuracy of the signals which they are given to process.

Prior art apparatus for ascertaining the phase coherency of signals processed in analog systems was incompatible with the improved digital processing devices. Prior art apparatus for determining the phase coherency of signals as used in digital systems was adequate provided the rate of phase shift between the signals was sufficiently large. However, when, in these digital systems, the rate of change in the phase shift between the signals was very small, the signals became indistinguishable from signals which were, in fact, phase coherent. Therefore, to realize the promised level of performance of the improved digital processing devices which required knowledge as to the phase coherency of input signals, there was a need for an improved apparatus for ascertaining when signals are phase coherent or when there is an on-going phase shift between signals. The present invention satisfies this need by providing, to an arbitrarily fine level of accuracy, apparatus for determining whether signals are phase coherent.

SUMMARY OF THE INVENTION

The present invention relates to a system for determining whether the pulse trains of signals which have known pulse repetition interval, stagger level, radio frequency and amplitude characteristics are phase coherent. The system includes apparatus which detects propagating signals having predetermined characteristics, apparatus which determines the phase difference between these detected signals, and apparatus which compares two phase differences which have been determined to decide the phase coherency of the signals.

More specifically, in the present invention, a memory stores the pulse repetition interval, stagger level, radio frequency and amplitude characteristics of the signals of interest for which other devices in the processing system require a determination of phase coherency. A suitably programmed, central processing unit obtains the identifying characteristics from this memory and operates through a receiver control comprised of a threshold register, a radio frequency register (RF register) and a dwell counter, to cause a receiver to detect first and second groups of pulses collected by an antenna which pulses correspond to the determined threshold and radio frequency. These groups of detected pulses are stored in a buffer memory comprised of a time of arrival memory (TOA memory), a radio frequency memory (RF memory) and an amplitude memory from which they are made available for use by the central processing unit by a buffer memory control. The central processing unit sorts the pulse trains which comprise one signal of interest from the first pulse group and sorts the pulse trains which comprise another signal of interest from the second pulse group. The processing unit then finds the phase difference of the end pulse of the longest pulse repetition interval of the pulse trains of the first dwell and the beginning pulse of the shortest pulse repetition interval of the pulse trains of the second dwell. After a predetermined time delay the above-described operation is repeated to obtain a second phase difference and the central processing unit then compares the two phase differences to determine whether the signals are phase coherent.

DESCRIPTION OF THE PREFERRED EMBODIMENT

FIGS. 1A through 1G and 2A through 2G illustrate the object of the disclosed apparatus which is to determine whether known signals are phase coherent or whether the signals have a rate of phase change which is very small. FIGS. 1A and 1B illustrate two signals which are phase coherent. The illustrated signal of waveform 1A may be developed from the combination of the three pulse trains represented in waveforms, 1C, 1D, and 1E which illustrate the amplitude envelope of three periodic, radio frequency (RF) pulse trains which have identical periods, $Period_{1C}$, $Period_{1D}$, and $Period_{1E}$. Since the pulse trains of waveforms 1C, 1D, and 1E have the same period, their combination to form signal 1A forms a pulse pattern which does not change over the duration of the signal 1A. The distance between successive pulses of signal 1A is known as the pulse repetition interval (PRI) and the time of arrival of the pulse at a particular point is commonly denoted as the TOA. Illustrated for signal 1A are $TOA_{1A1}$, $TOA_{1A2}$, $TOA_{1A3}$, and $TOA_{1A4}$ which are separated by $PRI_1$, $PRI_2$ and $PRI_3$. The time in which the pattern of FIG. 1A repeats itself is known as the cycle time C as illustrated for two cycles. The envelope of the RF of signal 1A is said to define a three stagger level pulse train of a pattern which cylically repeats over a known time period. The stagger level difines the number of individual pulses in the cyclical pattern of the signal. For example, a train of pulses in which the repeating pattern contains four pulses, each of which occur once each period would have a stagger level of four.

The illustrated signal of waveform IB may be developed from a single pulse train represented in waveform 1F which illustrates the amplitude envelope of the periodic, radio frequency (RF) pulse train having $Period_{1F}$ which is identical to $Period_{1C}$, $Period_{1D}$ and $Period_{1E}$. The distance between successive pulses of signal IB is known as the pulse repetition interval ($PRI_4$) and the time of arrival of the pulse at a particular point is commonly denoted as the TOA. Illustrated for signal 1B are $TOA_{1B1}$ and $TOA_{1B2}$ which are separated by $PRI_4$. The time in which the pulse of signal IB repeats itself is known as the cycle time as illustrated by the two cycles C. In the case of the signal 1B, the cycle time is equal to the $PRI_4$ value. Since the pulse trains 1C, 1D, and 1E, which comprise signal 1A, and the pulse train 1F, which comprises signal 1B, have identical periods, there is no change in the relative phase shift $\phi 1A_1$ between the pulse trains and the signals 1A and 1B are coherent as illustrated for the time interval $T_{1A}$. Even after the passage of a substantial time interval $I_1$, the pulse trains of FIGS. 1C, 1D, 1E and 1F will maintain the same phase relationships and the signals of FIGS. 1A and 1B will have the same phase shift as illustrated by $\phi 1A_2$ for the time interval $T_{1B}$.

Figure 2:
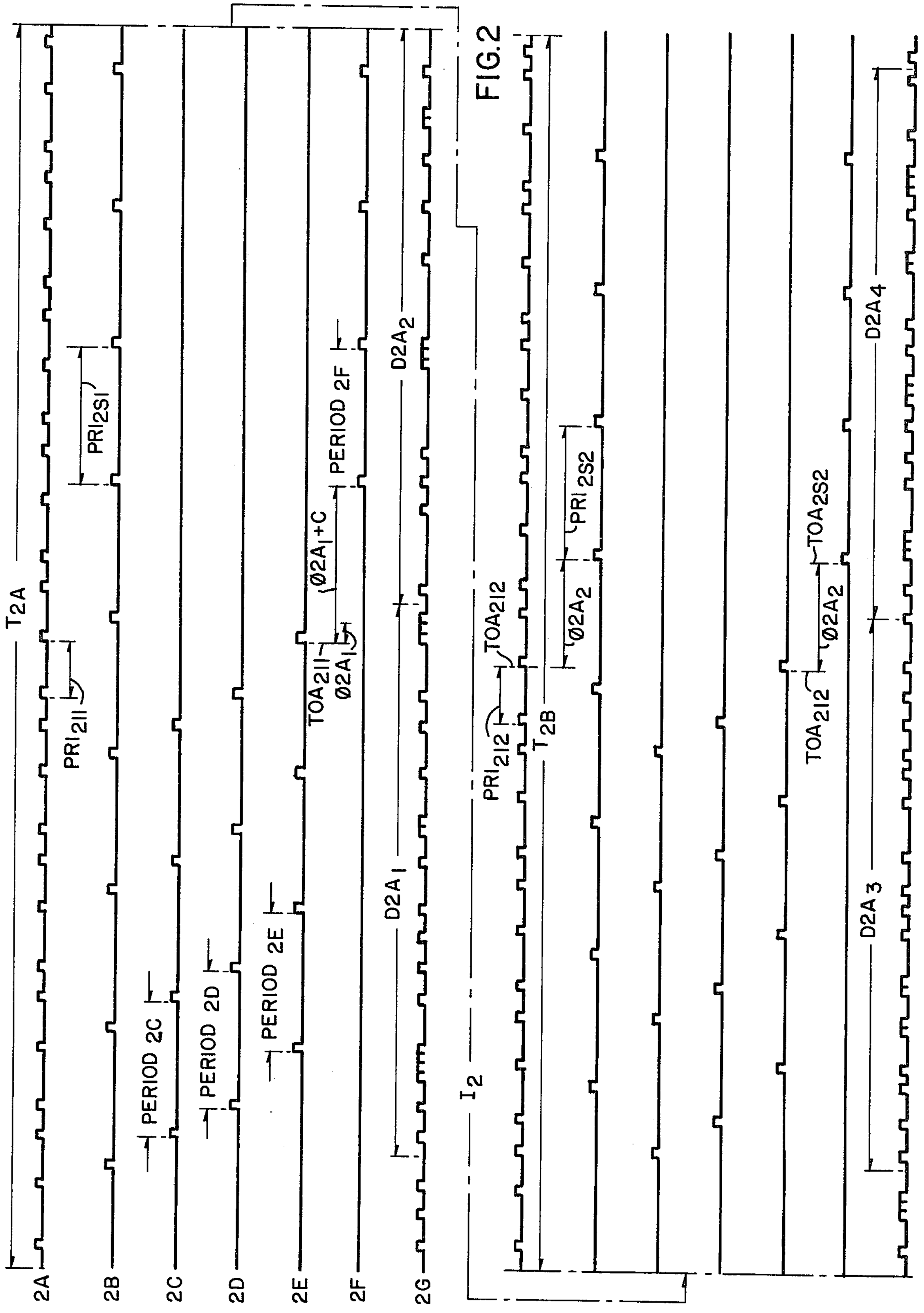
FIG. 2 represents two signals and the pulse trains which are sorted from them to illustrate the operation of the disclosed apparatus for the case of two signals which are not phase coherent.

In contrast to waveforms 1A and 1B, waveforms 2A and 2B of FIG. 2 show two signals which are not phase coherent. Signal 2A may be developed from the three pulse trains shown in waveforms 2C, 2D and 2E, and signal 2B may be developed from the pulse train shown in waveform 2F. The pulse trains 2C, 2D and 2E have equal periods indicated by $Period_{2C}$, $Period_{2D}$ and $Period_{2E}$ respectively. However, the period $Period_{2F}$ of the pulse train 2F is slightly shorter than the periods $Period_{2C}$, $Period_{2D}$, and $Period_{2E}$ of pulse trains 2C, 2D and 2E so that the phase of the signal 2B varies very slowly in time with respect to the phase of signal 2A. Since the phase of the signal 2B varies slowly, the phase relationship $\phi 2A_1$ of the signals 2A and 2B will appear to be the same for moderately short time intervals as indicated by time interval $T_{2A}$ but a substantial time later, as for example, after time period $I_2$, it becomes apparent that the phase of the pulse trains 2C, 2D, and 2E has changed in relation to pulse train 2F and the phase of signal 2A has changed in relation to signal 2B as illustrated by $\phi 2A_2$ for the time interval $T_{2B}$.

The object of the disclosed apparatus is to distinguish between truly phase coherent signals, such as the signals of FIGS. 1A and 1B, and signals which are not phase coherent, including those signals whose phase incoherency becomes manifest only after a substantial lapse of time, such as the signals of FIGS. 2A and 2B.

Figure 1:
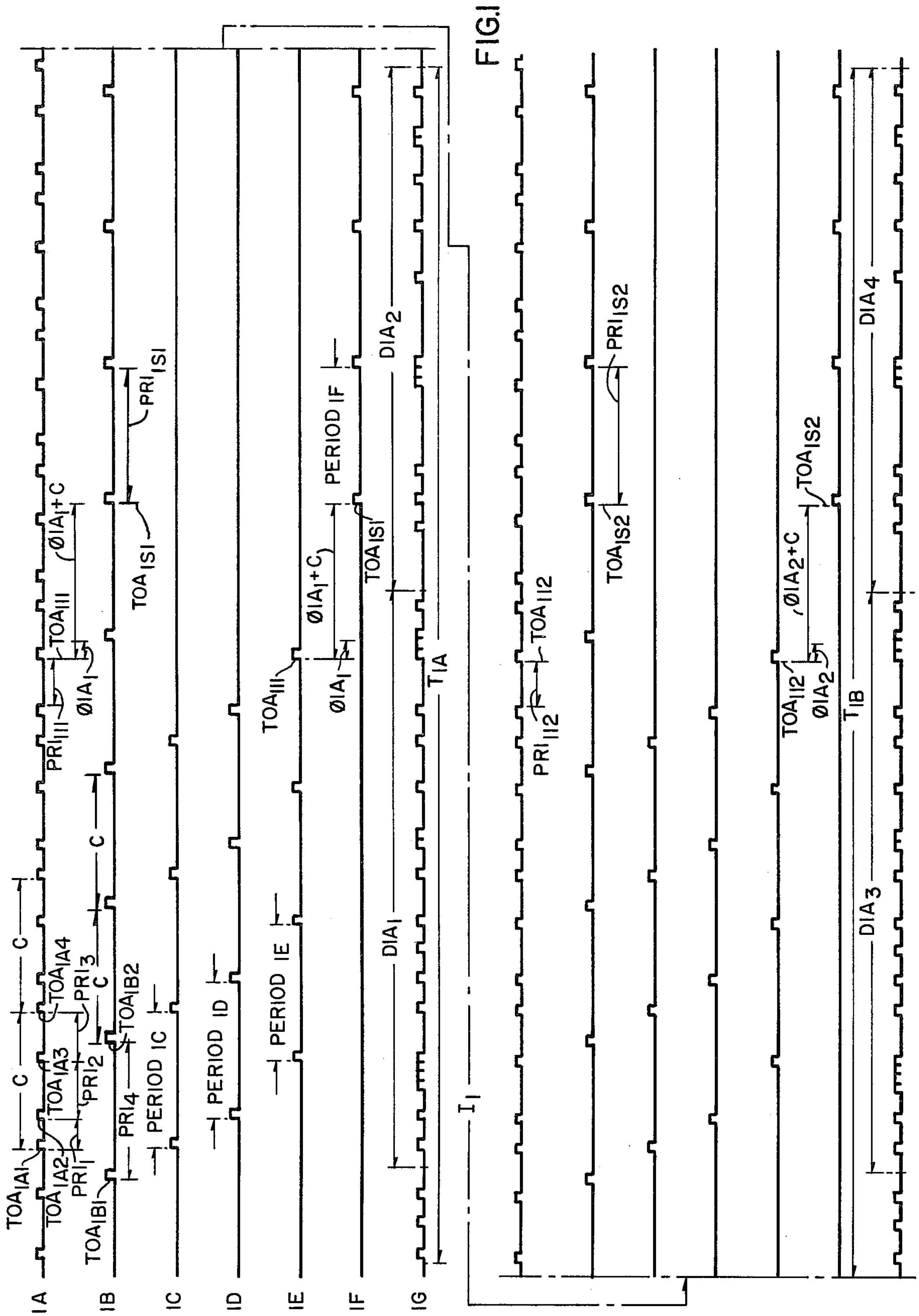
FIG. 1 represents two signals and the pulse trains which are sorted from them to illustrate the operation of the disclosed apparatus for the case of two phase coherent signals.

The operation of the disclosed apparatus for ascertaining whether signals are phase coherent is also illustrated in waveforms 1A through 1G of FIG. 1 and waveforms 2A through 2G of FIG. 2. As previously discussed, waveforms 1A and 1B represent signals which may be developed from the phase coherent pulse trains shown in waveforms 1C, 1D, 1E, and 1F. Waveforms 2A and 2B represent signals which may be developed from the pulse trains shown in waveforms 2C, 2D, 2E and 2F which, although they have similar periods, do not have identical periods and, therefore, are not phase coherent. It is the object of the disclosed invention to distinguish between the phase coherent signals of waveforms 1A and 1B and the non-phase coherent signals of waveforms 2A and 2B.

In the operation of the disclosed apparatus, within the time period $T_{1A}$, a first group of pulses, which set of pulses is hereafter referred to as pulse dwell $D1A_1$, of FIG. 1G, is detected, as for example, by a combination of an antenna and a receiver, in response to known parameters of the signal 1A for which phase coherency is to be tested. Also, within the time period $T_{1A}$, a second set of pulses, hereafter referred to as pulse dwell $D1A_2$, is then detected in response to second known values of parameters of the signal 1B for which phase coherency is to be tested. The pulse trains 1C, 1D, and 1E comprising the signal 1A are then sorted from the dwell $D1A_1$ and pulse train 1F comprising the signal 1B is then sorted from the dwell $DIA_2$. The pulse trains sorted from the first dwell $D1A_1$ are then compared to find the time of arrival $TOA_{1l1}$ of the last pulse within the dwell $D1A_1$, which is also the end pulse of the longest pulse repetition interval $PRI_{1l1}$ in the signal 1A. The pulse trains sorted from the second dwell $D1A_2$ are then compared to find the time of arrival $TOA_{1S1}$ of the first pulse of dwell $D1A_2$ which is also the beginning pulse of the shortest pulse repetition interval $PRI_{1S1}$ in the signal 1B. The end pulse $TOA_{1l1}$ of the longest $PRI_{1l1}$ of dwell $D1A_1$ and the beginning pulse $TOA_{1S1}$ of the shortest $PRI_{1S1}$ of dwell $D1A_2$ are then compared and, after the integral number of any cycle times C are subtracted to obtain the true phase shift, the phase $\phi 1A_1$ between the signals 1A and 1B is established.

After the expiration of a time interval $I_1$, which is significant in comparision to the duration of pulse dwells $D1A_1$, and $D1A_2$, two additional pulse dwells $D1A_3$ and $D1A_4$ are detected in response to the valves of parameters of signals 1A and 1B respectively as was done to obtain dwells $D1A_1$ and $D1A_2$. Analogous to the treatment of dwells $D1A_1$ and $D1A_2$, the pulse trains comprising the signal 1A are sorted from dwell $D1A_3$ and the pulse train comprising the signal 1B is sorted from dwell $D1A_4$. The end pulse $TOA_{1l2}$ of the last pulse within the dwell $D1A_3$ which is also the end pulse of the longest $PRI_{1l2}$ is found from the pulse trains 1C, 1D and 1E sorted from dwell $D1A_3$ and the $TOA_{1S2}$ of the first pulse within the dwell $D1A_4$ which is also the beginning pulse of the shortest $PRI_{1S2}$ is found from dwell $D1A_4$. The phase $\phi 1A_2$ between signals 1A and 1B is established by comparing the end pulse $TOA_{1l2}$ from the dwell $D1A_3$ and the beginning pulse $TOA_{1S2}$ from the dwell $D1A_4$ and subtracting any integral multiples of the cycle time C.

If the pulse trains of the signals 1A and 1B are all phase coherent, the phase $\phi 1A_2$ between the end pulse $TOA_{1l2}$ of dwell $DIA_3$ and the beginning pulse $TOA_{1S2}$ of dwell $D1A_4$ will substantially equal the phase $\phi 1A_1$ between the end pulse $TOA_{1l1}$ of dwell $D1A_1$ and the beginning pulse $TOA_{1S1}$ of dwell $D1A_2$. Therefore, the phase coherency of the signals 1A and 1B may be determined by comparing these two established phases $\phi 1A_1$ and $\phi 1A_2$. If the phases are substantially the same, allowing for errors generated by the disclosed apparatus itself, the signals 1A and 1B are phase coherent; if the phases are substantially different, the signals 1A and 1B are not phase coherent. From the illustration of FIG. 1A, it is seen that the established phases $\phi 1A_1$ and $\phi 1A_2$ of signals 1A and 1B are substantially equal so that the signal is determined to be phase coherent.

For the case of signals which have a small rate of phase change but which, nevertheless, are not phase coherent, consider the example presented in waveforms 2A through 2G of FIG. 2. A first set of pulses, pulse dwell $D2A_1$, is detected by the antenna and receiver in response to known parameters of the signal 2A for which phase coherency is to be tested. A second set of pulses, pulse dwell $D2A_2$ is then detected in response to second known values of parameters of the signal 2B for which phase coherency is to be tested. The pulse trains 2C, 2D, and 2E included in the signal 2A are then sorted from the dwell $D2A_1$ and the pulse train 2F, included in the signal 2B is sorted from the dwell $D2A_2$. The pulse trains 2C, 2D and 2E sorted from the first dwell $D2A_1$ are then compared to find $TOA_{211}$ the time of arrival of the last pulse of dwell $D2A_1$ which is also the end pulse of $PRI_{211}$ the longest pulse repetition interval in signal 2A. The pulse train 2F sorted from the second dwell $D2A_2$ is then used to find $TOA_{2S1}$ the time of arrival of the first pulse of dwell $D2A_2$ which is also the beginning pulse of $PRI_{2S1}$, the shortest pulse repetition interval in the signal 2B. The end pulse $TOA_{211}$ of the $PRI_{211}$ of dwell $D2A_1$ and the beginning pulse $TOA_{2S1}$ of the $PRI_{2S1}$ of dwell $D2A_2$ are then compared and, after subtracting any integral component of cycle times C, the actual phase shift $\phi 2A_1$ between the signals 2A and 2B is established.

After the expiration of a time interval $I_2$, which is significant in comparison to the duration of pulse dwells $D2A_1$ and $D2A_2$, two additional pulse dwells $D2A_3$ and $D2A_4$ are detected in response to the values of parameters of signals 2A and 2B respectively as was done to obtain dwells $D2A_1$ and $D2A_2$. Analogous to the treatment of dwells $D2A_1$ and $D2A_2$, the pulse trains 2C, 2D and 2E of the signal 2A, are sorted from dwell $D2A_3$ and the pulse train 2F of the signal 2B is sorted from dwell $D2A_4$. $TOA_{212}$, the last pulse of dwell $D2A_3$ which is also the end pulse of the longest $PRI_{212}$, is found from dwell $D2A_3$ and $TOA_{2S2}$, the beginning pulse of the shortest $PRI_{2S2}$, is found from dwell $D2A_4$. The phase $\phi 2A_2$ between the signals 2A and 2B is established from the difference of $TOA_{212}$ and $TOA_{2S2}$.

If the pulse trains of the signals 2A and 2B are phase coherent, the phase $\phi 2A_2$ between the end pulse $TOA_{212}$ of dwell $D2A_3$ and the beginning pulse $TOA_{2S2}$ of dwell $D2A_4$ will substantially equal the phase $\phi 2A_1$ between the end pulse $TOA_{211}$ of dwell $D2A_1$ and the beginning pulse $TOA_{2S1}$ of dwell $D2A_2$. From the illustration of FIGS. 2A and 2B, it can be seen that the established phases $\phi 2A_1$ and $\phi 2A_2$ between signals 2A and 2B are not substantially equal so that the signal is determined not to be phase coherent.

The disclosed apparatus for determining whether signals having known characteristics are phase coherent, is further described in relation to FIGS. 3, 4, 5 and 6. To initialize the operation of the present invention, a processing device 10, which, for example, could be a signal tracker or a signal intercept system as well known to those skilled in the pertinent art, cooperates with a central processing unit 12 to store identifying characteristics of the signals for which phase coherency is to be ascertained in memory 14. The signals could, for example, be the signals shown in FIGS. 1A and 1B or 2A and 2B. Central processing unit 12 and memory 14 may be comprised of a general purpose digital computer such as Westinghouse Millicomputer CP-1138 which has been in public use more than one year and which is more fully described in a publication entitled "CP-1138 millicomputer", Copyright © 1972 by Westinghouse Electric Corporation, and published by Westinghouse Electric Corporation, Defense and Electronic Systems Center, Systems Development Division, Baltimore, Md. According to the operation of the disclosed invention, central processing unit 12 retrieves the identifying characteristics of the signal for which phase coherency is to be ascertained from memory 14.

To illustrate the example of the preferred embodiment, the signal for which phase coherency is to be determined will be the signals 1A and 1B. As explained previously, for the signal 1A, the individual pulses which comprise the cyclical pattern occur at intervals of one cycle so that there is no relative movement between the pulses of the pattern; that is, the pulses are locked in phase. The distance between pulses of the cyclical pattern, which remains constant for respective pulses, is known as the pulse repetition interval (PRI). Since the pulses occur in a cyclical pattern and are locked in phase with respect to each other, the signal may be described by the sum of a number of pulse trains having the same period but shifted in phase with respect to each other as shown in FIGS. 1C, 1D, and 1E. Signal 1B may be similarly described by a single stagger level pulse train shown in FIG. 1F. The identifying characteristics of the signals 1A and 1B for which phase coherency is to be determined and which have been stored previously in memory 14 include the pulse repetition intervals, stagger level, radio frequency and pulse amplitude.

Central processing unit 12 retrieves these signal characteristics from memory 14 and performs dwell $D1A_1$ by providing signals on lines 16, 18, and 20 to receiver control 22 corresponding to the RF and amplitude parameters of signal 1A. Central processing unit 12 performs dwell $D1A_2$ by providing signals on lines 16, 18 and 20 corresponding to the RF and amplitude parameters of signal 1B. Receiver control 22 is comprised of threshold register 24, radio frequency register (RF register) 26 and enable signal generator 28 which includes dwell counter 30, an AND gate 32 and a clock 34. Threshold register 24 and RF register 26, respectively operate in response to signals provided by central processing unit 12 on lines 16 and 18 to provide an amplitude threshold control signal on line 36 and an RF control signal on line 38. Enable signal generator 28 provides an enable signal on line 40 in response to a signal provided to dwell counter 30 by central processing unit 12. This signal established a value in dwell counter 30 which is counted down by the rate at which pulses are provided from clock 34 to dwell counter 30 which provides an output signal to AND gate 32. AND gate 32 provides an enable signal on line 40 as long as the value of dwell counter 30 is positive. Therefore, if the clock 34 operates at a fixed rate, the duration of the enable signal on line 40 will be determined by the magnitude of the value established by the signal provided to dwell counter 30 by central processing unit 12.

An antenna 42 collects signals which are propagating in a predetermined area of space defined by the antenna design and position, and provides these signals to a receiver 44. In the example of FIG. 1G the signals collected by antenna 42 would include the pulse groups occurring over the time interval $T_{1A}$. In response to the parameters of signal 1A provided to receiver control 22, receiver 44 detects the dwell of pulses $D1A_1$ that substantially correspond to the RF frequency control signal on line 38 and to the amplitude threshold control signal on line 36 for the duration of the enable signal provided on line 40. Similarly in response to the parameters of signal 1B, receiver 44 detects the dwell of pulses $D1A_2$ that correspond to the RF frequency control signal on line 38 and to the amplitude threshold control signal on line 36 for the duration of the enable signal provided on line 40. The receiver 44 may be comprised of any such well known device which for example, may be Varian receiver, Part Number VZZ-3017 or Varian receiver, Part Number VZX-3017. The dwell $D1A_2$ is made by receiver 44 shortly after the detection of the dwell $D1A_1$ in response to a second signal provided to dwell counter 30 from the central processing unit 12.

The time of arrival, radio frequency, and amplitude of signals detected by receiver 44 are respectively provided on lines 46, 48 and 50, to buffer memory 52 which is comprised of time of arrival memory (TOA memory) 54, radio frequency memory (RF memory) 56, and amplitude memory 58. For each pulse detected by receiver 44, TOA memory 54 stores the time of arrival (TOA), RF memory 56 stores the frequency of the RF signal whose envelope determines the respective pulse, and amplitude memory 58 records the amplitude for each detected pulse in response to address and write signals provided by buffer memory control 66.

Buffer memory control 66 provides the appropriate address and write signals to the buffer memory 52 to provide for the storage of the information detected by receiver 44 in TOA memory 54, RF memory 56 and amplitude memory 58, and also provides the appropriate address and read signals to provide for the delivery of the pulse information stored in buffer memory 52 to central processing unit 12. Buffer memory control 66 may be comprised of any suitable combination of logic elements which would perform the above-described functions as is well known to those skilled in the pertinent art. The example of the preferred embodiment includes an AND gate 73 which is responsive to a TOA receiver strobe signal on line 74 and which supplies an enable signal on lines 75 and 76 to a one-shot generator 77 and a counter 78 respectively. One-shot generator 77 provides a TOA write signal on line 80 and a second one-shot generator 82, responsive to a receiver conversion signal on line 84, provides an amplitude and RF write signal on line 86. Counter 78 provides the TOA, RF and amplitude memory address signals on lines 88 and 90 in response to an enable signal from AND gate 73 on line 76, or in response to a combination of read and address signals on lines 94 and 96 respectively from processing unit 12. The address signals of couner 78 are also provided to a comparator 98 on lines 100 and 102. Comparator 98 is hard wired to provide a maximum count signal on line 104 to AND gate 73 unless comparator 98 determines that the capacity of the buffer memory has been exceeded.

When buffer memory control 66 operates to cause data detected by receiver 44 to be stored in buffer memory 52, AND gate 73 receives the TOA receiver strobe signal on line 74 from receiver 44. If the maximum count signal is present on line 104, AND gate 73 provides an enable signal to counter 78 which provides a pulse address on lines 88 and 90 to TOA memory 54, RF frequency memory 56, and amplitude memory 58 on lines 88 and 90. At the same time, AND gate 73 provides an enable signal to one-shot generator 77 which, as well known in the art, provides a short TOA write pulse on line 80 in response to an increase in the amplitude level of the signal on line 75 to permit receiver 44 to write into the TOA memory 54 at the address designated by counter 78. If receiver 44 determines that the pulse which arrived at the stored TOA contained the requisite RF and amplitude called for by the amplitude and RF control signals on lines 36 and 38 respectively, receiver 44 provides a receiver conversion signal to one-shot generator 82 on line 84. Similar to one-shot generator 77, one-shot generator 82 provides an amplitude and RF pulse on line 86 in response to an increase in the amplitude level of the signal on line 84 to permit receiver 44 to write the RF and amplitude of the pulse into RF memory 56 and amplitude memory 58 respectively at addresses determined by counter 78 and corresponding to the address at which the TOA of the pulse was stored in TOA memory 54.

Comparator 98 is hard wired such that, when all the addresses of TOA memory 54 have been filled, the maximum count signal is no longer provided on line 104 and AND gate 73 no longer provides an enable signal on lines 75 or 76 so that no more TOA's are stored in memory buffer 52. This is so that receiver 44 cannot write over information already stored in the buffer resulting in unreliable pulse data.

The central processing unit 12 obtains the TOA, RF and amplitude values of a pulse from buffer memory 52 by providing a read signal on line 94 and an address signal on line 96 to counter 78. The read and address signals from central processing unit 12 cause counter 78 to provide address and read signals on lines 88 and 90 which cause TOA memory 54, RF memory 56, and amplitude memory 58 to provide the TOA, RF and amplitude of the addressed pulse on lines 68, 70 and 72 respectively.

When receiver 44 detects the TOA of a pulse but the pulse does not have the requisite RF and amplitude required by the threshold and RF control signals on lines 36 and 38, one-shot generator 82 receives no receiver conversion signal on line 84 corresponding to the TOA receiver strobe signal on line 74 and no RF and amplitude write pulse is generated by one-shot generator 82. Therefore, no RF or amplitude information is stored in RF memory 56 or amplitude memory 58 at the address corresponding to that TOA value. When central processing unit 12 addresses this TOA, it is also given the information that no suitable RF or amplitude information corresponding to this TOA was obtained by receiver 44.

The TOA, RF and amplitude for each pulse, as stored in buffer memory 52 is made available on lines 68, 70 and 72 to the central processing unit 12 which sorts the pulse trains 1C, 1D, 1E and 1F comprising the signals 1A and 1B from pulse dwells $D1A_1$ and $D1A_2$ respectively which were detected by receiver 44 during the duration of the enable signal on line 40 and stored in buffer memory 52. The memory 14, receiver control 22, antenna 42, receiver 44, buffer memory 52, and buffer memory control 66 thus far described in relation to FIG. 3, together with the sorting operation of central processing unit 12, thus provides a means for detecting signals having known characteristics. The processor 12 then determines $\phi 1A_1$ the phase difference of $TOA_{111}$ of dwell $D1A_1$ and $TOA_{1S1}$ of dwell $D1A_2$ from the sorted pulse trains 1C, 1D, 1E and 1F to provide a means for determining the phase difference between signals of said detecting means. As will be explained with regard to FIGS. 4 and 6, this specific operation of the preferred embodiment is not universally applicable but affords a distinct advantage in those situations where it can be used. Where it cannot be used, it can be supplanted by other well-known operations which produce an equivalent result as is also generally described in relation to FIG. 6.

After an interval of time $I_1$ which is relatively long in comparison to the sampling of the dwells $D1A_1$ and $D1A_2$, receiver 44 is caused to detect dwell $D1A_3$ whose RF frequency and amplitude parameters correspond to the RF frequency and amplitude of the signal 1A by providing appropriate signals to receiver control 22 from central processing unit 12 in substantially the same manner as was done for dwell $D1A_1$. Likewise, dwell $D1A_4$ comprised of pulses having RF and amplitude parameters substantially similar to those of signal 1B are detected by receiver 44 in response to the command of central processing unit 12. Pulse trains 1C, 1D, 1E and 1F are sorted from the pulse dwells $D1A_3$ and $D1A_4$ shown in FIG. 1G in substantially the same manner as was done for the pulse trains sorted from the pulse dwells $D1A_1$ and $D1A_2$. Also, as was done for the pulse trains 1C, 1D, 1E and 1F of the pulse dwells $D1A_1$ and $D1A_2$, the phase difference $\phi 1A_2$ of the $TOA_{112}$ of dwell $D1A_3$ and the $TOA_{1S2}$ of dwell $D1A_4$ is determined.

To ascertain the phase coherency of the pulse trains 1C, 1D, 1E and 1F, central processing unit 12 compares the phase difference $\phi 1A_1$ between $TOA_{111}$ and $TOA_{1S1}$ as determined in relation to the pulse dwells $D1A_1$ and $D1A_2$ with the phase difference $\phi 1A_2$ between $TOA_{112}$ and $TOA_{1S2}$ as was determined in relation to the pulse dwells $D1A_3$ and $D1A_4$. Thus is provided a means for comparing a first phase difference of said determining means with a second phase difference of said determining means to decide the phase coherency of the signals for which the first and second phase differences were determined. If the phase of $\phi 1A_1$ is substantially the same as the phase of $\phi 1A_2$, the pulse trains 1C, 1D, 1E and 1F are determined to be phase coherent. Although the phase difference $\phi 1A_1$ between may be changing so slowly that a phase shift is not readily detectable over a short interval, the extended interval $I_1$ which occurs between the establishment of the first and second phase differences $\phi 1A_1$ and $\phi 1A_2$ provides a time in which a substantial phase shift will occur unless the first and second pulse trains are in fact, phase coherent. It is, therefore, two comparisons of the phase relation of the pulse trains which are separated by a substantial time interval upon which the operation of the disclosed apparatus is based.

Figure 3:
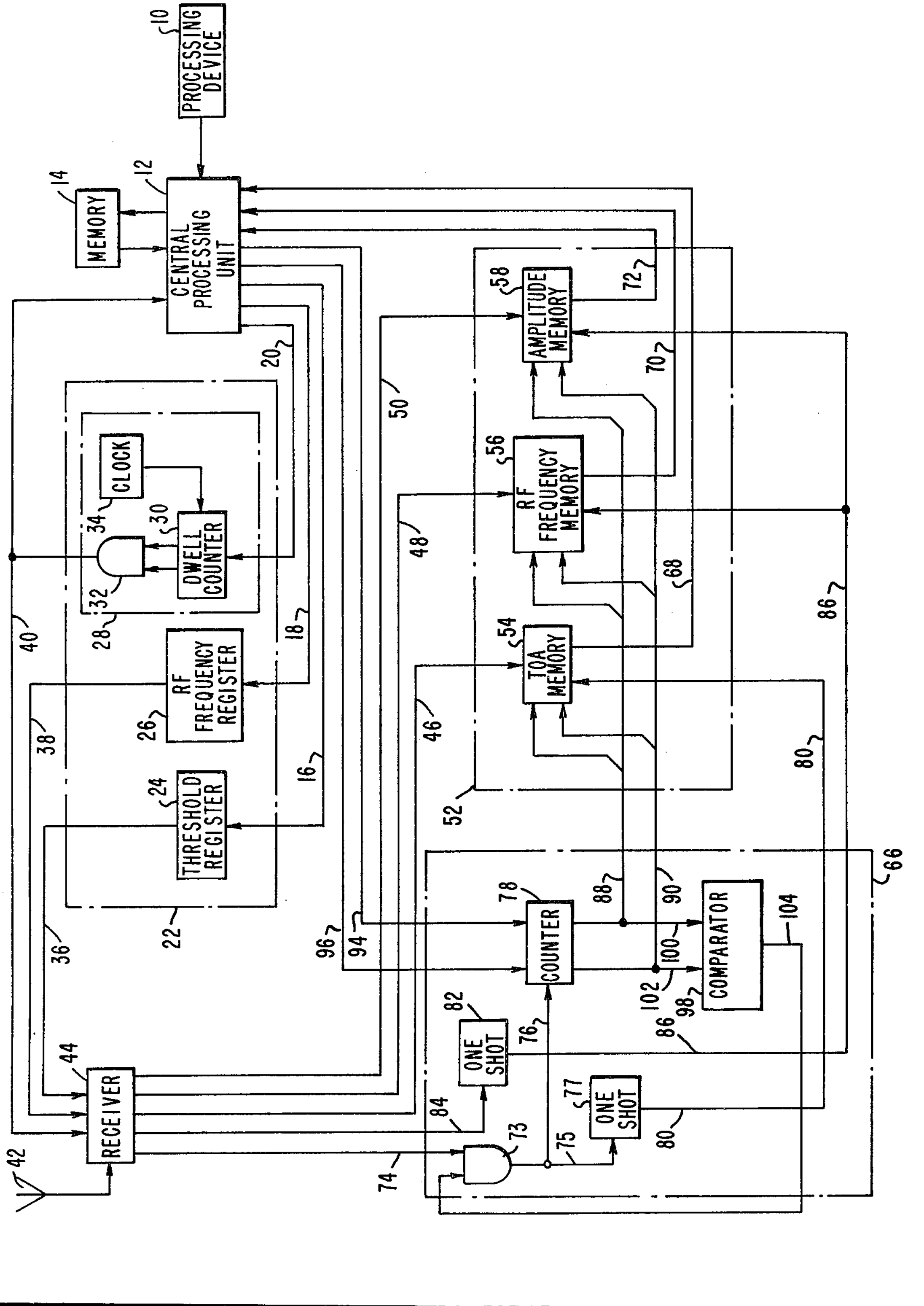
FIG. 3 is a block diagram showing the apparatus employed in the preferred embodiment of the present invention.

If, in the above example, the signals 2A and 2B had been used, the apparatus of FIG. 3 would have operated in substantially the same manner as described above to determine that phase difference $\phi 2A_1$ was substantially different from phase difference $\phi 2A_2$ and that, therefore, the pulse trains of signals 2A and 2B were not phase coherent.

Figure 4:
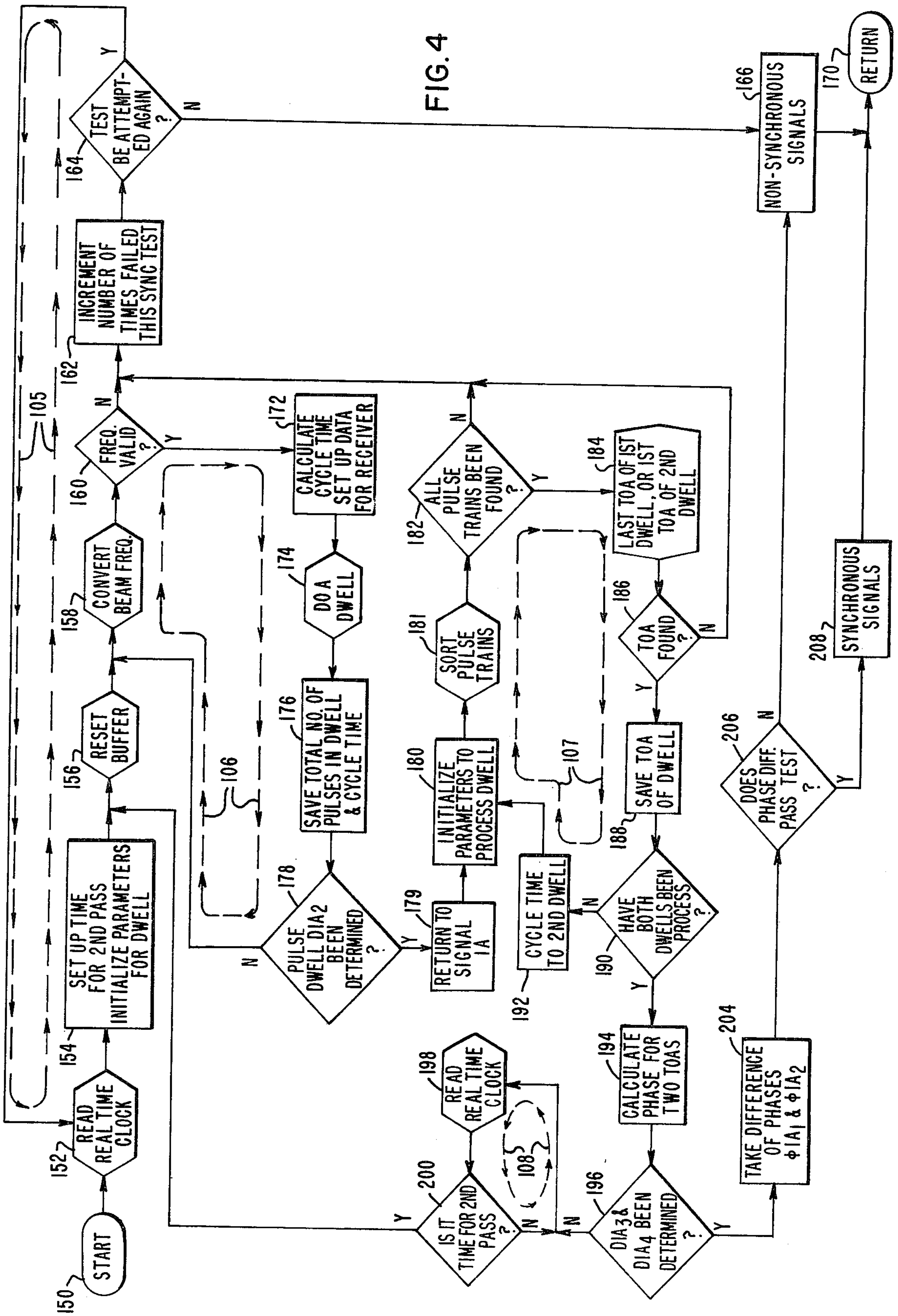
FIG. 4 is a flow chart describing in detail the operation of the central processing unit of FIG. 3 as programmed according to the listing of Appendix A.

FIG. 4 is a flow chart which describes in greater detail the operation of the apparatus shown in FIG. 3 to determine whether pulse trains comprising signals having known identifying characteristics are phase coherent. At the outset, it is pointed out that the geometric boxes denote identifiable steps which occur during the operation of the apparatus and that the geometric configuration of these boxes, in itself, has significance. Specifically, an oval shaped box, such as shown at step 150, indicates the initiation or completion of the operation; the hexagonally shaped box, as shown at step 152, indicates the performance of some subroutine; the rectangular shaped box, as shown at step 154, indicates the performance of some type of information processing; and the diamond shaped box, as indicated at step 160, denotes the making of an alternative decision.

Briefly, loop 105 comprises an initialization loop which determines that the appropriate pulse parameters are being used. For the signals illustrated in FIGS. 1A and 1B, the dwell $D1A_1$ is detected by receiver 44 in a first pass through the loop 106; and the dwell $D1A_2$ is detected by receiver 44 on a second pass through loop 106. On a first pass through loop 107, the pulse trains 1C, 1D, and 1E comprising the signal 1A are sorted, and $TOA_{111}$, the last TOA of $PRI_{111}$ the longest PRI between pulses, is found and stored. On the second pass through loop 107, the pulse train 1F comprising the signal 1B is sorted from the second dwell $D1A_2$, and $TOA_{1S1}$, the first TOA of $PRI_{1S1}$, the shortest PRI of this signal is found and stored. At step 194, $\phi 1A_1$ the phase difference between $TOA_{111}$ and $TOA_{1S1}$ which have been found from loop 107 is calculated.

In loop 108, the central processing unit 12 delays further processing for a predetermined time interval $I_1$ which interval is of sufficient duration to permit even a slight phase shift between pulse trains 1C, 1D, 1E and 1F to manifest itself. After the expiration of $I_1$, the process returns to loop 106 where dwells $D1A_3$ and $D1A_4$ are procured in substantially the same manner as explained previously in relation to dwells $D1A_1$ and $D1A_2$. The process then proceeds again to loop 107 which finds $TOA_{112}$ and $TOA_{1S2}$ in substantially the same manner as was used to find $TOA_{111}$ and $TOA_{1S1}$. Step 194 then calculates $\phi 1A_2$.

The method then determines that $\phi 1A_2$ has been obtained and proceeds to step 204 where the phase shift $\phi 1A_1$ obtained from the pulse dwells $D1A_1$ and $D1A_2$ is subtracted from the phase shift $\phi 1A_2$ obtained from the pulse dwells $D1A_3$ and $D1A_4$. At step 206, if this difference is less than some arbitrary but predetermined value, which, ideally, would be zero, the decision is made that the pulse trains 1C, 1D, and 1E comprising signal 1A are phase coherent with the pulse train 1F of signal 1B. If, however, the difference taken at step 204 is equal to or greater than the predetermined value the determination is made that the pulse trains, and therefore the signals 1A and 1B, are not phase coherent.

As a more detailed explanation of the flow chart of FIG. 4, the step 150 is an oval shaped box indicating the initiation of the operation of the disclosed apparatus. For the case of a computer program for central processing unit 12 this is the directive of an executive program controlling the general performance of central processing unit 12. At step 152 the time on the real time clock 34 (FIG. 3) is noted and at step 154 the characteristics for the signals 1A and 1B including the pulse repetition interval, stagger level, radio frequency and amplitude are retrieved from memory 14 and made readily available to central processing unit 12. At step 156 any former values contained in buffer memory 52 are erased and at step 158 the value of the signal 1A RF frequency is converted from a digital value compatible with the processor 12 to a value which is meaningful to the RF register 26 of receiver control 22. At step 160, a check is made to determine whether the converted pulse frequency is valid. Assuming first that the frequency is invalid, step 162 maintains a running count of the number of times the frequency has been found to be invalid or, for other reasons explained later, the operation of the disclosed apparatus could not be completed. At step 164 it is decided whether another attempt to obtain a valid frequency should be made. If it is determined that another attempt should be made, the process is begun again at step 152. If, however, it is determined, at step 164, that another attempt would be futile, the operation of the apparatus of FIG. 4 cannot be completed and, arbitrarily, a determination that the pulse trains are not synchronized, that is, that they are not phase coherent, is made at step 166 which determination is stored in memory 11 and the operation is terminated at step 170 which, in the case of a computer program, would be a return to the executive program. Alternatively, it could have been assumed that the pulse trains were synchronized but an assumption of non-synchronization has been elected for the preferred embodiment. Since the decisive phase coherency test was never completed, either assumption would be equally speculative.

Returning to step 160 and assuming that, at some point, a valid frequency is found, the operation proceeds to step 172 at which the dwell time, cycle time and the threshold amplitude of the signal 1A are calculated. The dwell time is the time for which the enable signal generator 28 of receiver control 22 will enable receiver 44 to detect pulses having the RF frequency and amplitude threshold which are indicated by the RF frequency control signal and amplitude threshold control signal provided by threshold register 24 and RF register 26 in response to central processing unit 12. At step 174, the values to be provided to the threshold register 24, the RF register 26 and the enable signal generator 28 by central processing unit 12, which were calculated at step 172, are provided to receiver control 22 to cause receiver 44 to detect a first dwell of pulses $D1A_1$ collected by antenna 42 which have the indicated RF frequency and the necessary amplitude. At step 176 the total number of pulses detected at step 174 and the cycle time calculated at step 172 are stored.

Next, a decision is made as to whether the second pulse dwell $D1A_2$ has yet been determined at step 178. If the second pulse dwell has not yet been determined the method returns to step 158 where, as before for signal 1A, the pulse frequency of signal 1B is converted to a value compatible with RF register 26 of receiver control 22. The operation of the disclosed apparatus then proceeds analogously as described above in relation to the first dwell $D1A_1$ until pulse dwell $D1A_2$ is obtained and step 178 is again encountered at which dwell $D1A_2$ will have been detected.

Figure 5:
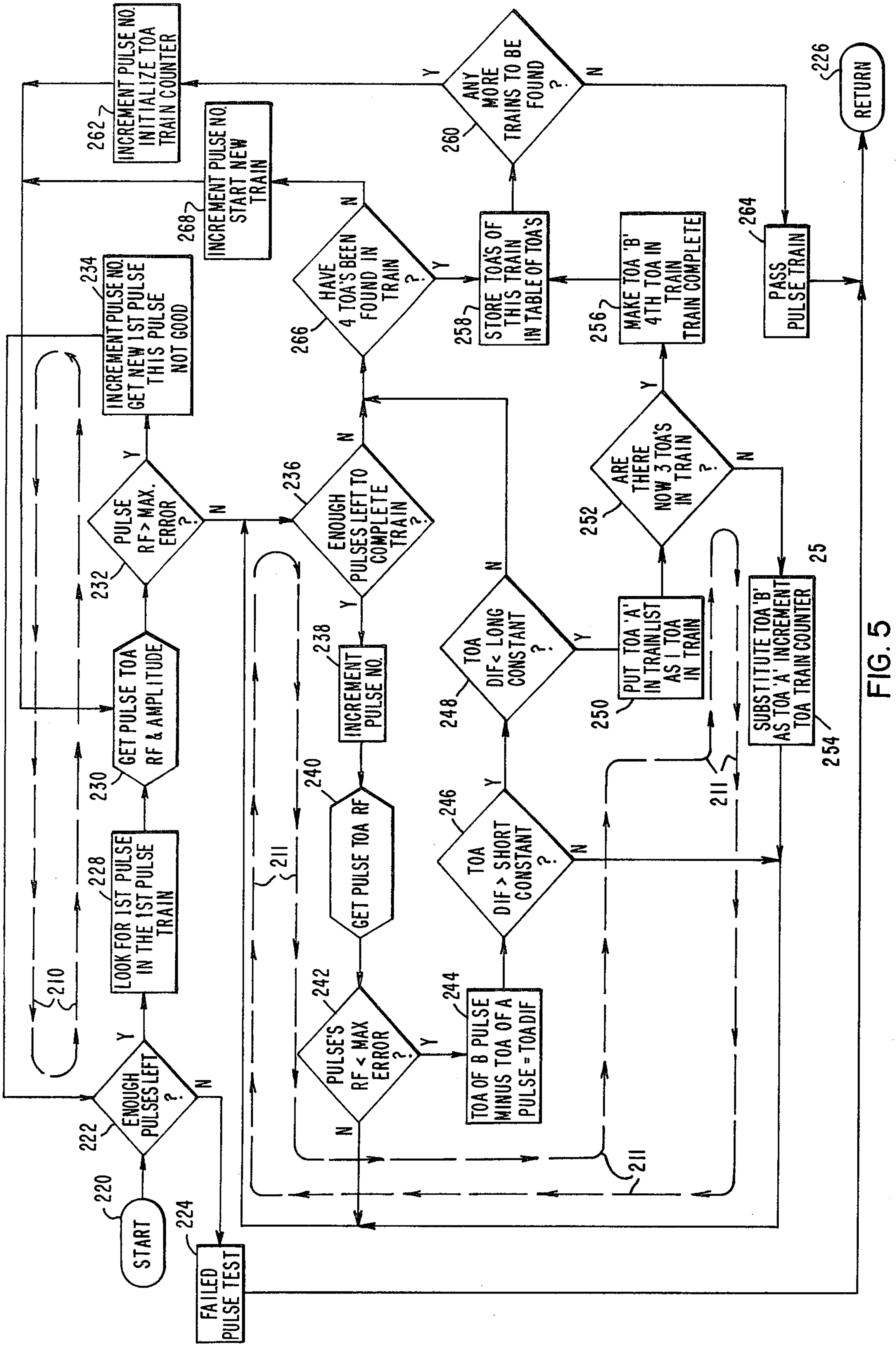
FIG. 5 is a flow chart describing a subroutine used by the central processing unit to sort the pulse trains of the signals whose phase coherency is determined according to the flow chart of FIG. 4.

The operation then proceeds to step 179 at which the focus of attention of the processing unit 12 is returned to the characteristics of the first dwell $D1A_1$ and the operation proceeds to step 180 which recalls the pulse repetition intervals, RF and stagger level of the signal 1A from memory 14 to make it presently available for the central processing unit 12. Proceeding to step 181, the pulses contained in the dwell $D1A_1$ and corresponding to the pulse trains 1C, 1D and 1E, which comprise the signal 1A, are sorted from the pulse dwell $D1A_1$ which was detected by receiver 44 when step 174 was undertaken to detect signals whose characteristics correspond to the signal 1A. A more detailed explanation of the operation for sorting the pulse trains comprising signal 1A from the group of detected pulses of dwell $D1A_1$ is shown in FIG. 5 which will be described later. For continuity, the present description proceeds to step 182 where it is decided whether pulse trains which would be representative of all three stagger levels in the signal 1A have been sorted. If not, there is insufficient information to proceed with the disclosed phase coherency test and the operation returns to step 162 which will indicate that the attempt has failed and, unless too many previous attempts have failed as indicated at step 164, the operation must begin over again at step 152. If however, pulse trains 1C, 1D, and 1E, representative of all the stagger levels in the signal 1A are present at step 182, the operation proceeds to step 184 where $TOA_{111}$ the last TOA of $PRI_{111}$ the longest pulse repetition interval in signal 1A is found. A description of this operation is more fully explained in relation to FIG. 6. At step 186 it must be decided whether $TOA_{111}$ was found. If not, there is still insufficient information to proceed and the operation returns to steps 162 and 164 to determine if another attempt to determine phase coherency should be made. If however, $TOA_{111}$ was found at step 184, the operation proceeds to step 188 to which $TOA_{111}$ is stored and then to step 190 where it is decided whether pulses detected at both dwells $D1A_1$ and $D1A_2$ have yet been processed through loop 107. At this point in the operation, dwell $D1A_2$ has not yet been processed through loop 107 and the operation proceeds to step 192 which is to note that the second dwell is to now be considered and also to change the cycle time to that of the second dwell.

The operation of the apparatus proceeds as before from step 180 through step 190, except that this time step 184 finds $TOA_{1S1}$ the time of arrival of the beginning pulse of $PRI_{1S1}$, the shortest pulse repetition interval of signal 1B. In a manner analogous to the dwell $D1A_1$, at step 180 the parameters for the dwell $D1A_2$ are set up and at step 181 the pulse trains 1C, 1D, and 1E comprising signal 1A are sorted as will be described in relation to FIG. 5. At step 182 if a pulse train for each stagger level in signal 1B has not been found, the operation of the apparatus returns to step 162, otherwise it proceeds to step 184. As subsequently described in relation to FIG. 6, the step 184 finds, for the dwell $D1A_2$, $TOA_{1S1}$, the first TOA of $PRI_{1S1}$, the shortest PRI of signal 1B. If $TOA_{1S1}$ is present at step 186, $TOA_{1S1}$ is saved at step 188.

For the example of the preferred embodiment, the last $TOA_{111}$ of the dwell $D1A_1$ and the first $TOA_{1S1}$ of the dwell $D1A_2$ were particularly determined because it was established, as a predetermined condition, that in the signals for which phase coherency was to be determined, in the present instance signals 1A and 1B, there would be a single PRI value which was the longest and a single PRI value which was the shortest. Considerable processing time can be saved if the phase between the signals is determined in relation to these continuously identifiable intervals as opposed to performing a complete overlay of the signals which would require a comparison between each pulse of both signals. However, where the signals whose phase coherency is to be tested have at least two PRI's which are equal to each other but longer than any other PRI's in the signal, or which are equal to each other but shorter than any other PRI's in the signal, the operation of the preferred embodiment disclosed in FIG. 6 would be inconclusive and an operation amounting to an implementation of a complete overlay of both signals would become necessary. This limitation of the applicability of FIG. 6 does not limit the scope of the present invention since computer programs which perform such overlay operations substantially equivalent to the disclosed operation, are well known to those skilled in the art of computer programming, and could easily be applied to the disclosed apparatus for determining the phase coherency of signals.

After this second pass through loop 107, the operation proceeds from step 190 to step 194 where the phase shift $\phi 1A_1$ is determined by subtracting periods of one cycle of signal 1A from the difference between the last $TOA_{111}$ and the first $TOA_{1S1}$ until the remainder is less than one cycle time. As well known to those skilled in the art, this reduction is $\phi 1A_1$, the phase difference between $TOA_{111}$ and $TOA_{1S1}$, will eliminate the possibility that the apparatus will determine a phase shift which is a harmonic of the actual phase shift.

After the phase shift $\phi 1A_1$ has been calculated at step 194, the operation proceeds to step 196 and determines whether $D1A_3$ and $D1A_4$ have yet been determined. If not, at step 198 the real time clock 34 is again read and the time which has elapsed since the reading of the real time clock 34 at step 152 is determined. At step 200 the decision is made as to whether a predetermined time $I_1$ has elapsed since the reading of the real time clock 34 at step 152. If not, the operation returns to step 198 and reads real time clock 34 once again before returning to step 200. This cyclical process continues until, at step 200 the decision is made that the predetermined amount of time $I_1$ has elapsed since the real time clock 34 was read at step 152 and the operation returns to step 156 to detect $\phi 1A_2$, the phase shift between $TOA_{112}$ and $TOA_{1S2}$ in substantially the same manner previously described in relation to $\phi 1A_1$. $TOA_{112}$ is the last occurrence of the end pulse of $PRI_{112}$ the longest pulse repetition interval of signal 1A as determined by the pulse trains 1C, 1D and 1E, sorted from dwell $D1A_3$. $TOA_{1S2}$ is the first occurrence of the beginning pulse of $PRI_{1S2}$, the shortest pulse repetition interval of signal 1B as determined by the pulse train 1F sorted from dewll $D1A_4$.

After determining both $\phi 1A_1$ and $\phi 1A_2$, the operation moves to step 204 which determines the difference of $\phi 1A_1$ and $\phi 1A_2$. If this difference is less than a predetermined value which allows for errors introduced by the disclosed apparatus itself, the pulse trains are determined to be phase coherent at step 208 which determination is stored before the operation of the disclosed apparatus is terminated at step 170.

If the difference between $\phi 1A_1$ and $\phi 1A_2$ is determined to be greater than the predetermined value at step 206, the pulse trains comprising the signal are determined not to be phase coherent at step 166. As explained earlier, and as illustrated in waveforms 1A through 1G and 2A through 2G, signals 1A and 1B would be determined to be phase coherent. Examples of signals which would be determined not to be phase coherent are signals 2A and 2B shown in waveforms 2A and 2B.

FIG. 5 is a flow chart describing in detail the operation of the preferred embodiment in which step 181 of FIG. 4 sorts pulse trains 1C, 1D, 1E and 1F from dwells $D1A_1$, $D1A_2$, $D1A_3$ and $D1A_4$. Briefly, the operation shown in FIG. 5 is as follows. In loop 210 a first pulse is acquired which could be a member of a pulse train included in signal 1A signal 1B depending on whether dwells $D1A_1$ and $D1A_3$ or dwells $D1A_2$ and $D1A_4$ are under consideration. The pulse dwell under consideration, as determined by loop 107 of the flow chart of FIG. 4, is then interrogated in loop 211 to find the next pulse of the dwell which could also be a member of the pulse train. If, by its RF, this second pulse could also be a member of the pulse train, the determination is made as to whether the TOA of this pulse corresponds to the cycle time which signal 1A or 1B is known to have. If the TOA is too short, the next succeeding pulse is examined at step 242, but if the TOA is too long, the interrogation of the pulse dwell is started anew with the pulse succeeding the pulse at which the previous interrogation was begun starting at step 230 in the previously described loop 210. Once a pulse is identified by its TOA and RF as being a member in the particular pulse train, its position relative to other members of the same train is indexed before continuing the search of other TOA's of the pulse train. When four TOA's in each pulse train have been found and indexed, the sorting of the pulse trains from the pulse dwell is noted before the operation returns to the flow chart shown in FIG. 4 at step 226.

The flow chart of FIG. 5, which is the subroutine which was indicated at step 181 of the flow chart in FIG. 4 for sorting from a detected pulse dwell, the pulse trains comprising the signals 1A and 1B, will now be described in greater detail. In FIG. 5, the operation proceeds from its initiation at step 220 to step 222 where a decision is made as to whether enough pulses from a pulse dwell remain to provide a pulse train for the signals 1A or 1B. Where there are no longer enough pulses left in the pulse dwell to comprise a pulse train, there is insufficient information to provide a pulse train, and the operation proceeds to step 224 where an indication is made that all the pulse trains of the signal are not present and the operation then returns, at step 226, to the flow chart described in FIG. 4. Where, at step 222, there are a sufficient number of pulses left to form a pulse train of the signal, the operation proceeds to step 228 where an examination is made for the first pulse in the particular pulse train which has been designated as the first train and at step 230 the pulse parameters of TOA, radio frequency and amplitude are acquired. At step 232, the decision is made as to whether the radio frequency of the pulse is greater than a maximum permissible error. If so, the pulse is unuseable and the operation moves to the next pulse in the pulse dwell as indicated at step 234 and begins the process of loop 210 again starting at step 222 with this next pulse.

If, at step 232, the radio frequency of the pulse is equal to or less than a maximum permissible error, the operation enters loop 211 at step 236 where a decision is made as to whether there are enough pulses left in the pulse dwell to complete a pulse train of four pulses. If so, the operation proceeds to step 238 which increments the index characters which identify the order of the pulses in the train, the next pulse for which the TOA, radio frequency and amplitude are recorded is obtained at step 240, and the radio frequency of this pulse is checked against a maximum permissible error at step 242. If the radio frequency exceeds the maximum permissible error, the operation returns to step 236 and, as before, determines whether there are enough pulses left to complete the pulse train. If, at step 242, the pulse radio frequency does not exceed maximum permissible error, the TOA of the second pulse is subtracted from the TOA of the first pulse at step 244. If at step 246 this TOA difference is less than the cycle time of the signal plus a predetermined constant which allows for measurement error and signal jitter, the operation returns to step 236 and proceeds as before. It at step 246, the TOA difference is greater than the cycle time plus a predetermined constant, step 248 determines whether the difference is also less than a cycle time plus a second predetermined constant. If at step 248, the TOA difference is also less than a cycle time plus the second predetermined constant, the apparatus records the TOA as comprising one TOA of the pulse train at step 250. At step 252, a determination is made as to whether there exists three TOA's in the particular pulse train. If not, at step 254 the identifying number of the TOA which was recorded at step 250 subordinates the identifying number of prior determined TOA's; the TOA pulse train counter, which counts the number of pulses in the train, is incremented; and the operation returns to step 236. The incrementing of the TOA pulse train counter at step 254 will result in the initiation of the search for a new TOA of the pulse train at step 236. When, at step 252, it is determined that there are three existing TOA's in the particular pulse train for which the pulse dwell is being examined, the operation moves to step 256 at which the last found TOA is made the fourth TOA in the pulse train and the train is considered complete. At step 258 the four TOA's of the pulse train are then stored in a TOA pulse train table and the apparatus determines, at step 260, by comparison with the known stagger level of the signal, whether there are any more pulse trains to be found. If so, the pulse number is incremented, the TOA train counter is initialized at step 262 and the operation returns to step 230 to sort the next pulse train. If, from a comparison with the stagger level of the signal, it is determined at step 260 that there are no more pulse trains to be obtained from the pulse dwell, the operation proceeds to step 264 where an indication is made that the pulse trains have been sorted from the pulse dwell, and at step 226 the operation returns to the flow chart shown in FIG. 4. If, during the course of the previously described operation, it is determined at step 236 that there are no longer enough pulses left in the dwell to complete a particular pulse train or if it is determined at step 248 that the difference of the TOA of the second pulse minus the TOA of the first pulse is not less than the cycle time plus a predetermined constant, the operation includes step 266 which determines whether four TOA's have been found in the pulse train. If four TOA's have been found, a pulse train may be comprised and the apparatus proceeds to step 258 and continues as explained previously. If, however, four TOA's have not been found at step 266, the number of the first pulse for the pulse train is incremented and a new train is started at step 268 by returning the operation to step 230.

Figure 6:
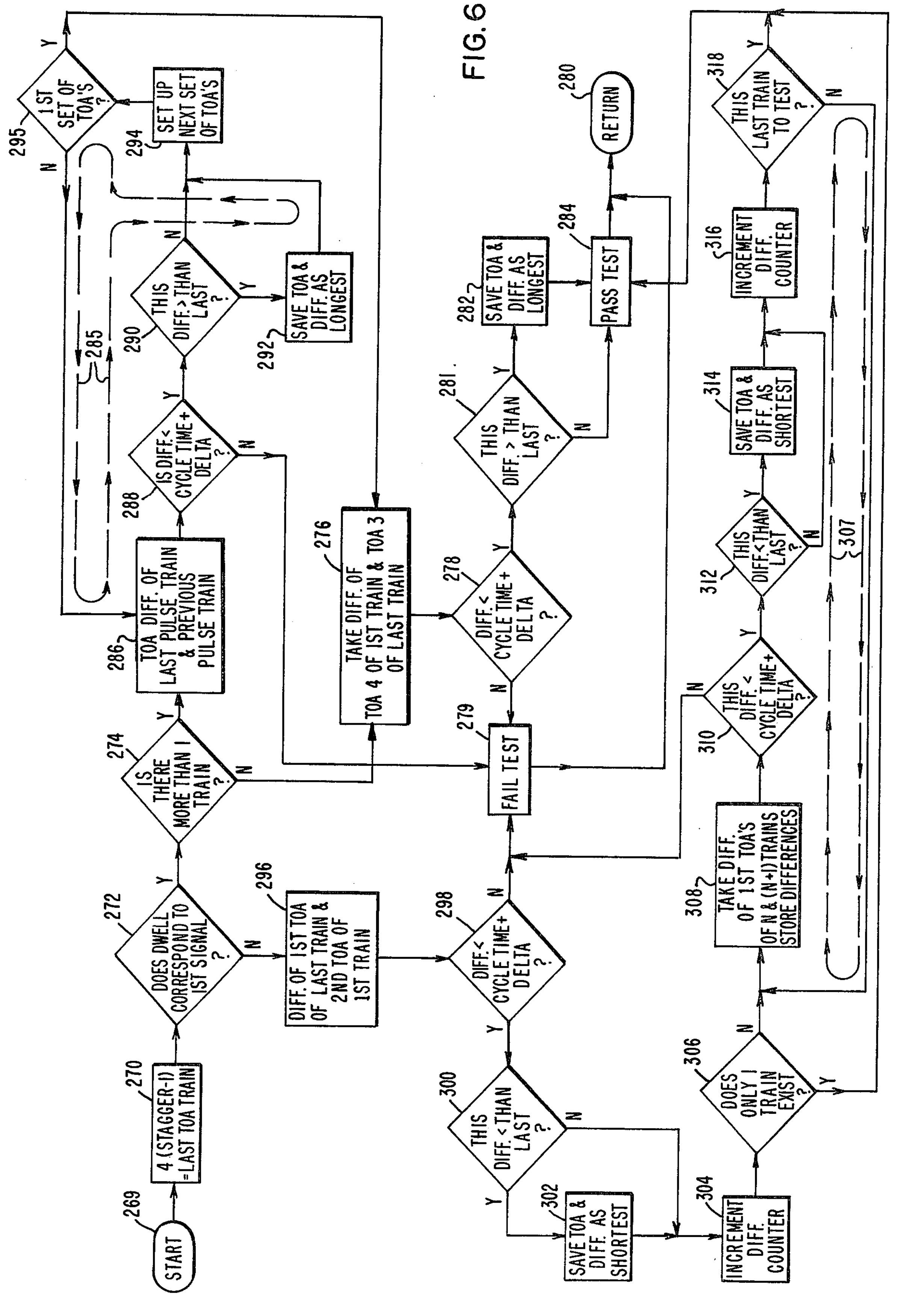
FIG. 6 is a flow chart describing a subroutine used by the central processing unit to determine TOA's of the end pulse of the longest PRI between pulse trains sorted by the flow chart of FIG. 5, and to determine TOA's of the beginning pulse of the shortest PRI between pulse trains sorted by the flow chart of FIG. 5.

FIG. 6 shows a detailed flow chart of the operation employed at step 184 of FIG. 4 for finding the last occurrence of the end TOA of the longest PRI of the signal for a first group and finding the first occurrence of the beginning TOA of the shortest PRI of the signal for a second pulse group. Briefly, the operation of FIG. 6 can be described as follows. Step 272 considers whether the pulse dwell corresponding to signal 1A or signal 1B is under examination. For the case of the pulse dwell corresponding to a first signal, signal 1A, step 274 decides whether the signal has more than one pulse train. If only one pulse train is involved, steps 276, 278, 281 and 282 determine that the last TOA of the pulse train has been found. If the first signal is comprised of multiple stagger levels, loop 285 determines the longest pulse repetition interval between the last TOA's of separate pulse trains and step 276 determines the TOA difference between the fourth TOA of the first pulse train and the third TOA of the last pulse train so that steps 278, 281, and 282 determine the longest pulse repetition interval between the last TOA's of the pulse trains and also the end TOA of this longest pulse repetition interval.

If the second pulse dwell corresponding to signal 1B is under consideration, steps 296, 298, 300, 302 and 304 determine the TOA difference between the first TOA of the last pulse train and the second TOA of the first pulse train. If the second pulse dwell consists of only a single pulse train, step 306 and 284 indicate the value of the first TOA of the shortest pulse repetition interval in the signal to the operation of FIG. 4. If the second pulse dwell has multiple pulse trains, the loop 307 determines the shortest pulse repetition interval between the first TOA's of consecutively numbered pulse trains and provides the value of the beginning TOA associated with the shortest pulse repetition interval to step 284.

More specifically, the operation of FIG. 6 starts at step 269 and at step 270 determines the last TOA's on the list of pulse trains stored at step 258 of the flow chart of FIG. 5 by multiplying the difference of the stagger level of the first signal 1A minus one (stagger level$_{1A}$-1) by the number of TOA's in the pulse trains sorted in FIG. 5 which, in the example of the preferred embodiment, is four. Step 272 first considers the pulse dwell associated with the first signal to be detected, signal 1A, and the operation proceeds to step 274 which determines whether this pulse dwell includes more than one pulse train. If the pulse dwell consists of only one pulse train, the apparatus takes the difference of the fourth TOA of the first train and the third TOA of the last train at step 276 and at step 278 determines whether this difference is less than the signal's cycle time plus delta, a predetermined margin which allows for measurement error and signal train jitter. In a dwell containing only a single pulse train, the pulse train is considered to be both the first and last train in the pulse dwell. If the difference of the TOA's is not less than the cycle time plus delta, step 279 indicates that the last occurrence of the end TOA of the longest PRI of the first pulse dwell cannot be found and at step 280 the operation returns to the flow chart of FIG. 4. If the difference between the third and fourth TOA's is less than the cycle time plus delta, step 281 decides whether this difference is larger than the largest previously recorded difference. In the case of a pulse dwell having a single pulse train which is presently considered, there is no prior TOA difference and the value of the difference between the fourth TOA and the third TOA is saved at step 282. Finally, step 284 indicates that the last occurrence of the end TOA of the longest pulse repetition interval in the signal 1A has been found and then at step 280 the operation returns to the operation described in the flow chart in FIG. 4.

Returning to step 274 of FIG. 6, if the pulse dwell contains more than one pulse train, the operation proceeds to step 286 which determines the difference of the fourth TOA of the last pulse train and the fourth TOA of the previous pulse train which difference is then stored. At step 288 the difference determined by step 286 is compared with the cycle time plus delta. If this difference is greater than the cycle time plus delta the operation proceeds to step 279 which indicates that the last occurrence of the end TOA of the longest PRI in the signal cannot be determined and the operation returns to the flow chart of FIG. 4 at step 280. If the difference determined at step 286 is less than the cycle time plus delta, step 290 decides whether this difference is also larger than the largest previously recorded distance. For the first difference, there is no previously recorded difference and the first difference is stored as the longest difference at step 292. Step 294 then sets up the comparison of the above mentioned previous pulse train of TOA's with the next prior pulse train and, if all the pulse trains have not yet been considered, as determined by step 295, the operation returns to step 286 to determine the difference between the fourth TOA's of these pulse trains. The operation proceeds as described previously through steps 288, 290, 292, and 294 to determine whether this next difference in TOA's is greater than the previous largest difference. When all the pulse repetition intervals of the signal, as established from the difference of the last TOA between consecutively numbered pulse trains have been considered, step 276 considers whether the difference between the fourth TOA of the first train and the third TOA of the last train is greater than any of the differences previously determined in step 276. Step 286 thereby completes the examination of all the PRI's of the signal 1A. In the same manner as described with regard to a single pulse train, steps 278, 281 and 282 then determine whether the difference determined by step 276 is greater than any difference previously determined by loop 285 and the largest of these is then provided to step 284 and at step 280, to the flow chart of FIG. 4.

Returning to step 272, when the pulse dwell associated with the second signal 1B is to be considered, the first occurrence of the beginning pulse of the shortest PRI must be determined. Step 296 considers the second TOA's of the first pulse train and the first TOA of the last pulse train and determines their difference. If the pulse dwell contains only one pulse train this pulse train is considered to be both the first and last pulse train. Step 298 then decides whether this difference is less than the cycle time plus delta. If the difference is not less than the cycle time plus delta, the first occurrence of the beginning pulse of the shortest PRI of the signal 1B cannot be determined and the operation proceeds to so indicate at step 279 and returns to the flow chart of FIG. 4 at step 280. If step 298 determines that the difference of step 296 is less than the cycle time plus delta, step 300 decides that if this difference is shorter than any previously recorded difference it will be saved at step 302. In either event, step 304 will increment the difference counter which identifies the pulse trains that are being considered. Step 306 then determines whether the second pulse dwell contains only a single pulse train. If the second pulse dwell has only a single pulse train, step 284 indicates that the first occurrence of the beginning pulse of the shortest PRI of the signal 1B has been determined and the operation of FIG. 6 returns to FIG. 4 at step 280. If, at step 306, it is determined that a pulse dwell of multiple pulse trains is involved, step 308 takes the difference of the first TOA's of the first and second pulse trains and stores this difference. Step 310 then determines whether this difference is less than the sum of the cycle time plus delta and, if not, step 279 indicates that the first occurrence of the beginning pulse of the shortest PRI cannot be determined and the operation of FIG. 6 returns to FIG. 4 at step 280. If step 310 decides that the difference determined at step 308 is less than the sum of the cycle time plus delta, step 312 determines whether this difference is shorter than any previously recorded difference. If the difference is shorter, step 314 stores the value of the first TOA and the difference as being the shortest. In either case, step 316 then increments the difference counter to advance consideration of the pulse trains to the next two consecutively numbered trains and step 318 decides whether there are any more pulse trains of the pulse dwell left to test. If there are remaining pulse trains, the apparatus returns to step 308 and the difference of the first TOA of the second and third pulse trains are tested at steps 310 and 312 and 314 as was described previously. The process continues until step 318 indicates that the last pulse train has been tested. Loop 307, together with step 296, have thereby examined all of the PRI's of the signal 1B to find the first occurrence of the beginning TOA of the shortest PRI in signal 1B. Step 284 indicates that the first occurrence of the beginning TOA of the shortest PRI in the second pulse dwell which was associated with the second signal 1B has been found and the operation of FIG. 6 returns to FIG. 4 at step 280 of FIG. 6.

A program listing which has actually been used in implementation of the apparatus described in FIGS. 3, 4, 5 and 6 is included in Appendix A.

```
WESTINGHOUSE MILLI ASSEMBLER

9014.   62  0                          $(R8CBNI)
9015.   67                                       LIT      R8DBNI
9016.                                  * THIS ROUTINE DOES THE HARD SYNC TEST
9017.                                  R8HRDSY   ENTL     R8HRDSYX,R8DBNI,R8CBNI
9017.   67  12
9017.   67  12
9017.   62  0
9017.   62  0  11 5 0   12 + 67
9018.                                  R8HSTRT
9019.                                            JSG      U3CLOCK,U3CLOCKX,R8DBNI
9019.   61
9019.   62  1  10 5 0    1 + 60
9019.   52  2   1 5 0    0
9019.   52  3  11 5 0   32 + 61
9019.   62  4  11 6 0   33 + 61
9019.   52  5  10 6 0  365 + 61
9019.   62  6  10 5 0   32 + 61
9019.   52  7   1 5 0    0
9019.   67
9020.   62  10 12 0 0   25 + 67              A        A0,R8DELTA
9021.   62  11 11 0 0   24 + 67              ST       A0,R8CLOCK
9022.   62  12 10 1 0  201 + 67              LO       A1,(0)
9023.   62  13 11 1 0   27 + 67              ST       A1,R8PASS
9024.   62  14 11 1 0   30 + 67              ST       A1,R8DWNUM
9025.                                  R8HLAB1
9026.                                            JSG      U18RSET,U18RSETX,R8DBNI
9026.   41
9026.   62  15 10 5 0    1 + 60
9025.   52  16  1 5 0    0
9026.   52  17 11 5 0    6 + 61
9026.   52  20 11 6 0    7 + 61
9026.   62  21 10 6 0  353 + 61
9026.   62  22 10 5 0    5 + 61
9026.   62  23  1 5 0    0
9026.   67
9027.                                  R8DOOWL                     * LOOP TO DO A DWELL
```

```
62   24 10 5 0  30 + 67     LD         IX,R8DWNUM
62   25 10 1 0 201 + 67     LD         A1,(2)
62   26 10 0 1  17 + 67     LD,        A0,R8BRF
62   27 10 4 0 211 + 67     LD         M0,(R1DBN1*/8)
62   30  1 4 0   0          XB         M0
62   31 11 0 0 205 + 63     ST         A0,R8FREQH
62   32 11 1 0 212 + 63     ST         A1,R8THRSHH
62   33  1 4 0   0          XB         M0
                            JSG        R1FCON1,R1FCON1X,R8DBN1
61
62   34 10 5 0   1 + 60
62   35  1 5 0   0
62   36 11 5 0  40 + 61
62   37 11 6 0  41 + 61
62   40 10 6 0 354 + 61
62   41 10 5 0  40 + 61
62   42  1 5 0   0
67
62   43  3 0 0   5          TGEZ       A0               * WAS FREQ VALID
62   44  5 0 0 304 + 62     J          R8HLAB38         * NO, FAIL SYNC
62   45 10 5 0  30 + 67      LD         IX,R8DWNUM
62   46 10 4 0 214 + 67     LD         M0,(R1DBN1*/8)
62   47  1 4 0   0          XB         M0
62   50 11 3 0 215 + 63     ST         A3,R8BOSELH
62   51 11 0 0 206 + 63     ST         A0,R8VCOH
62   52  1 4 0   0          XB         M0
62   53 10 1 1  15 + 67     LD,        A1,R8PRI
62   54 14 1 1  21 + 67     M,         A1,R8STGLV
62   55  2 4   0  1         SRL        M0,1
62   56 11 4 0  31 + 67     ST         M0,R8CYLTM       * PRI * STAGGER = CYCLE TIME
62   57  2 4   0  2         SLL        M0,1             * 4 * CYCLE TIME = DWELL TIME
62   60 10 1 0 201 + 67     LD         A1,(0)           * MIN DWELL = 2 * CYCLE TIME
62   61 10 2 0 202 + 67     LD         A2,(1)           * DELTA DWELL = 2 * CYCLE TIME
62   62 10 3 0 214 + 67     LD         A3,(R1DBN1*/8)
62   63  1 3 0   0          XB         A3
62   64 11 4 0 216 + 63     ST         M0,R8MDWELH
62   65 11 4 0 217 + 63     ST         M0,R8DDWELH      * DATA FOR RECEIVER
62   66 11 1 0 211 + 63     ST         A1,R8CWBITH
62   67 11 1 0 213 + 63     ST         A1,R8CALBTH
62   70 11 1 0 214 + 63     ST         A1,R8VCAH
62   71 11 2 0 210 + 63     ST         A2,R8YIGBYH
62   72  1 3 0   0          XB         A3
62   73 10 1 0 113 + 67     LD         A1,R8XMITBL
62   74 10 2 0 114 + 67     LD         A2,R8LIMITS
62   75  1 3 0   0          XB         A3
62   76 11 1 0 220 + 63     ST         A1,R8BLANKH
62   77 11 2 0 207 + 63     ST         A2,R8PWLIMH
63                           LIT        R1DBN1
                           . JSL        R2RSET
62  100 10 5 0 377 + 63
62  101 10 6 0 341 + 63
62  102 10 4 0 275 + 63     LD         M0,(R8DBN1*/8)
62  103  1 4 0   0          XB         M0
67                           LIT        R8DBN1
                            JSG        U1BINFO,U1BINFOX,R8DBN1
61
62  104 10 5 0   1 + 60
62  105  1 5 0   0
62  106 11 5 0  16 + 61
62  107 11 6 0  17 + 61
62  110 10 6 0 355 + 61
62  111 10 5 0  16 + 61
62  112  1 5 0   0
67
62  113 10 5 0  30 + 67     LD         IX,R8DWNUM
62  114 11 1 1  46 + 67     ST,        A1,R8LENGTH
62  115 10 0 0  31 + 67     LD         A0,R8CYLTM
62  116 11 0 1 125 + 67     ST,        A0,R8CYI
62  117  3 5 0   2          TEZ        IX               * TIME FOR SECOND DWELL
62  120  5 0 0 124 + 62     J          R8FIN            * DID BOTH DWELLS
62  121 12 5 0 202 + 67     A          IX,(1)           * YES
62  122 11 5 0  30 + 67     ST         IX,R8DWNUM
62  123  5 0 0  24 + 62     J          R8DODWL
                  R8FIN
62  124 10 5 0 203 + 67     LD         IX,(0)
62  125 11 5 0  30 + 67     ST         IX,R8DWNUM
62  126 10 1 1 125 + 67     LD,        A1,R8CYI
62  127 11 1 0  31 + 67     ST         A1,R8CYLTM
                  R8LABND
62  130 10 5 0  30 + 67     LD         IX,R8DWNUM
62  131 10 1 0  31 + 67      LD         A1,R8CYLTM
62  132 12 1 0 124 + 67      A          A1,R8DCT
62  133 11 1 0 127 + 67      ST         A1,R8CYDLT
62  134 10 1 0  33 + 67     LD         A1,R8K2
62  135 14 1 1  21 + 67     M,         A1,R8JITER       *
62  136  2 4   0  1         SRL.       M0,1
62  137 12 4 0  32 + 67     A          M0,R8K1
62  140 11 4 0  34 + 67     ST         M0,R8KONST       * CONSTANT =K1 +(K2 * JITTER)
62  141 10 1 0  31 + 67     LD         A1,R8CYLTM
62  142 13 1 0  34 + 67     S          A1,R8KONST       * SHORT = PRI- CONSTANT
62  143 11 1 0  35 + 67     ST         A1,R8SHORT
62  144 10 1 0  31 + 67     LD         A1,R8CYLTM
62  145 12 1 0  34 + 67     A          A1,R8KONST
62  146 11 1 0  36 + 67     ST         A1,R8LONG        * LONG = PRI + CONSTANT
62  147 10 1 1  21 + 67     LD,        A1,R8STGLV
62  150  2 1   1  2         SLL        A1,2
62  151 11 1 0  37 + 67     ST         A1,R8PLSND       * STAGGER LEVEL * 4 = NO. OF PULSES NEEDED
62  152 10 0 0 203 + 67     LD         A0,(0)           * INITIALIZE SOME PARAMETERS
62  153 11 0 0  42 + 67     ST         A0,R8PULSE       * STARTING PULSE NUMBER OF TRAIN
62  154 11 0 0  40 + 67     ST         A0,R8TRNTOA      * COUNT OF TOAS IN TRAIN
62  155 11 0 0  41 + 67     ST         A0,R8NUMTRN      * NUMBER OF TRAINS FOUND
62  156 11 0 0  43 + 67     ST         A0,R8COUNT       * PULSE COUNT FOR TRAIN
62  157 11 0 0  45 + 67     ST         A0,R8CNTTOA      * TOTAL TOA COUNT
62  160 10 5 0  30 + 67      LD         IX,R8DWNUM
62  161  3 5 0   5           TNZ.       IX
62  162  5 0 0 173 + 62      J          R8GO
62  163 10 0 1  46 + 67      LD,        A0,R8LENGTH
62  164 10 2 1  46 + 67      LD,         A2,R8LENGTH
62  165 13 5 0 202 + 67      S          IX,(1)
62  166 13 2 1  46 + 67      S,         A2,R8LENGTH
62  167 11 2 0  44 + 67      ST         A2,R8TP2
62  170 13 0 0  44 + 67      S          A0,R8TP2
62  171 11 0 0  43 + 67      ST         A0,R8COUNT
62  172 12 5 0 202 + 67      A          IX,(1)
                  R8GO
                             JSL        R8CHKPL,R8CHKPLX,R8DBN1
62  173 10 5 0 265 + 67
62  174 10 6 0 266 + 67
62  175  3 0 0   6           TGEZ       A0
62  176  5 0 0 304 + 62      J          R8HLAB38
                             JSL        R8CHKDF,R8CHKDFX,R8DBN1
62  177 10 5 0 267 + 67
62  200 10 6 0 270 + 67
62  201  3 0 0   6           TGEZ       A0
62  202  5 0 0 304 + 62      J          R8HLAB38
                  R8HLAB27
62  203 10 5 0  30 + 67     LD         IX,R8DWNUM
62  204 10 1 0 116 + 67     LD         A1,R8TSAVE
62  205 11 1 1 117 + 67     ST,        A1,R8TOASV       * STORE TOA FROM DWELL
62  206  3 5 0   2          TEZ        IX               * FIRST DWELL?
62  207  5 0 0 215 + 62     J          R8HLAB30         * NO, SECOND DWELL
62  210 12 5 0 202 + 67     A          IX,(1)           * YES, START NEXT DWELL
62  211 11 5 0  30 + 67     ST         IX,R8DWNUM
62  212 10 1 1 125 + 67      LD,        A1,R8CYI
62  213 11 1 0  31 + 67      ST         A1,R8CYLTM
62  214  5 0 0 130 + 62      J          R8LABND
                  R8HLAB30                              * TWO DWELLS DONE
62  215 10 1 1 117 + 67     LD,        A1,R8TOASV       * SUBTRACT LAST TOA OF FIRST DWELL
62  216 13 5 0 202 + 67     S          IX,(1)           * FROM FIRST TOA OF SECOND DWELL
62  217 13 1 1 117 + 67     S,         A1,R8TOASV
62  220 10 5 0  27 + 67     LD         IX,R8PASS
62  221 11 1 1 121 + 67     ST,        A1,R8PHDIF       * SAVE PHASE
                  R8LP3
62  222 13 1 0  31 + 67     S          A1,R8CYLTM
62  223  3 1 0   6           TGEZ       A1
62  224  5 0 0 227 + 62      J          R8PSC
62  225 11 1 1 121 + 67     ST,        A1,R8PHDIF       * NO, ASSUME MISSING PULSE
62  226  5 0 0 222 + 62      J          R8LP3
                  R8PSC
```

```
62  227  3 5 0    2              TEZ    IX               . YES, NOW IS THIS PASS ONE?
62  230  5 0 0  251 . 62         J      R8HLAB33         . NO, SECOND PASS IS DONE
                        R8HLAB31                          . YES, DO PASS TWO
                                 JSG    U3CLOCK,U3CLOCKX,R8DBNI
61
62  231 10 5 0    1 . 60
62  232  1 5 0    0
62  233 11 5 0   32 . 61
62  234 11 6 0   33 . 61
62  235 10 6 0  365 . 61
62  236 10 5 0   32 . 61
62  237  1 5 0    0
67
62  240 13 0 0   26 . 67         S      A0,R8CLOCK
62  241  3 0 0    6              TGEZ   A0               . IS IT TIME TO DO PASS TWO
62  242  5 0 0  231 . 62         J      R8HLAB31         . NOT TIME TO DO PASS TWO
62  243 10 5 0   27 . 67         LD     IX,R8PASS        . YES IT IS TIME
62  244 12 5 0  202 . 67         A      IX,(1)
62  245 11 5 0   27 . 67         ST     IX,R8PASS
62  246 10 0 0  203 . 67         LD     A0,(0)
62  247 11 0 0   30 . 67         ST     A0,R8DWNUM
62  250  5 0 0   15 . 62         J      R8HLAB1
                        R8HLAB33
62  251 10 1 1  121 . 67         LD,    A1,R8PHDIF       . TAKE DIFFERENCE OF BOTH PHASES
62  252 13 5 0  202 . 67         S      IX,(1)
62  253 13 1 1  121 . 67         S,     A1,R8PHDIF
62  254  3 1 0    1              TLZ    A1               . IS DIFFERENCE NEGATIVE ?
62  255  5 0 0  260 . 62         J      R8POSPH          . NO, POSITIVE
62  256 16 1 0  215 . 67         N      A1,(01777777)    . YES, MAKE POSITIVE
62  257 12 1 0  202 . 67         A      A1,(1)
                        R8POSPH
62  260 13 1 0   34 . 67         S      A1,R8KONST       . PHASE DIFFERENCE MAY BE DELTA DIFFERENCE
62  261  3 1 0    1              TLEZ   A1               . IS PHASE LESS THAN DELTA DIFFERENT
62  262  5 0 0  302 . 62         J      R8HLAB37         . NO, DID NOT PASS SYNC TEST
62  263 10 0 0  202 . 67         LD     A0,(1)           . PASSED SYNC TEST
                        R8HLAB35
62  264 10 1 0  215 . 67         LD     A1,(01777777)    . SYNC TEST HAS COMPLETED PROCESSING
62  265 10 4 0    0 . 60         LD     H0,GLOBBA
62  266  1 4 0    0              XB     H0
62  267 11 1 0   53 . 60         ST     A1,HARDSYNC      . TEST IS DONE ON BEAMS
62  270 11 0 0   54 . 60         ST     A0,SYNRSUL       . RESULTS OF TEST
62  271  1 4 0    0              XB     H0
                                 JSG    U1BRSET,U1BRSETX,R8DBNI
61
62  272 10 5 0    1 . 60
62  273  1 5 0    0
62  274 11 5 0    6 . 61
62  275 11 6 0    7 . 61
62  276 10 6 0  353 . 61
62  277 10 5 0    6 . 61
62  300  1 5 0    0
67
                                 RETL   R8HRDSTX
62  301 10 6 0   12 . 67
62  302 10 0 0  203 . 67 R8HLAB37 LD    A0,(0)           . NON SYNCED BEAMS
62  303  5 0 0  264 . 62         J      R8HLAB35
                        R8HLAB38                          . FAILURE OF SYNC TEST
62  304 10 1 0  123 . 67         LD     A1,R8NTIMES      . NUMBER OF TIMES FAILED
62  305 12 1 0  202 . 67         A      A1,(1)
62  306 11 1 0  123 . 67         ST     A1,R8NTIMES
62  307 13 1 0  130 . 67         S      A1,R8ATEMPT
62  310  3 1 0    1              TLZ    A1               . MAY ATTEMPT AGAIN ?
62  311  5 0 0  302 . 62         J      R8HLAB37         . NO, ASSUME NON SYNCED
62  312  5 0 0    1 . 62         J      R8HSTRT          . YES, TRY AGAIN
45    0                          . ********************************R8CHKP      *******************
67                      $(RACBN2)
                                 LIT    R8DBNI
67   13                 R8CHKPL  ENTL   R8CHKPLX,R8DBNI,R8CBN2
67   13
45    0
45    0 11 5 0   13 . 67
                        R8HLAB2
45    1 10 5 0   30 . 67         LD     IX,R8DWNUM
45    2 10 1 1   46 . 67         LD,    A1,R8LENGTH
45    3 13 1 0   41 . 67         S      A1,R8COUNT
45    4 11 1 0   50 . 67         ST     A1,R8RMPUL       . REMAINING PULSES
45    5 10 1 0   37 . 67         LD     A1,R8PLSND
45    6 13 1 0   50 . 67         S      A1,R8RMPUL
45    7  3 1 0    1              TLEZ   A1               . ARE THERE ENOUGH PULSES?
45   10  5 0 0  171 . 45         J      R8HFAIL          . NO, FAILS SYNC TEST
                        R8HLAB3                           . YES, FIRST PULSE IN TRAIN STORED
45   11 11 0 0   42 . 67         ST     A0,R8PULSE
                                 JSG    U1BPULS,U1BPULSX,R8DBNI
61
45   12 10 5 0    1 . 60
45   13  1 5 0    0
45   14 11 5 0   20 . 61
45   15 11 6 0   21 . 61
45   16 10 6 0  354 . 61
45   17 10 5 0   20 . 61
45   20  1 5 0    0
67
45   21 11 1 0   51 . 67         ST     A1,R8TOAA
45   22 13 2 0  295 . 67         S      A2,(010000)      . CORRECT FINE FREQ. FOR CENTER
45   23 11 2 0   55 . 67         ST     A2,R8FFSTOR      . STORE CORRECTION FACTOR FOR FF
45   24  3 2 0    1              TLZ    A2               . TEST FOR NEGATIVE FINE FREQ.
45   25  5 0 0   30 . 45         J      R8HLAB4          . NO, POSITIVE
45   26 16 2 0  215 . 67         N      A2,(01777777)    . YES NEGATIVE
45   27 12 2 0  202 . 67         A      A2,(1)
                        R8HLAB4
45   30 13 2 0   53 . 67         S      A2,R8FFERR1
45   31  3 2 0    4              TGZ    A2               . IS FINE FREQ. GREATER THAN MAX ERROR
45   32  5 0 0   37 . 45         J      R8HLAB6          . NO, GET MORE PULSES LIKE THIS ONE
                        R8HLAB5                           . YES, NOT GOOD, TRY AGAIN
45   33 10 0 0   41 . 67         LD     A0,R8COUNT
45   34 12 0 0  202 . 67         A      A0,(1)
45   35 11 0 0   41 . 67         ST     A0,R8COUNT
45   36  5 0 0    1 . 45         J      R8HLAB2
                        R8HLAB6
45   37 10 5 0   30 . 67         LD     IX,R8DWNUM
45   40 10 0 1   46 . 67         LD,    A0,R8LENGTH
45   41 13 0 0   41 . 67         S      A0,R8COUNT
45   42  3 0 0    4              TGZ    A0               . ARE THERE ANY PULSES LEFT?
45   43  5 0 0  154 . 45         J      R8HLAB18         . NO
45   44 10 0 0   41 . 67         LD     A0,R8COUNT       . YES
45   45 12 0 0  202 . 67         A      A0,(1)
45   46 11 0 0   41 . 67         ST     A0,R8COUNT
                                 JSG    U1BPULS,U1BPULSX,R8DBNI
61
45   47 10 5 0    1 . 60
45   50  1 5 0    0
45   51 11 5 0   20 . 61
45   52 11 6 0   21 . 61
45   53 10 6 0  356 . 61
45   54 10 5 0   20 . 61
45   55  1 5 0    0
67
45   56 11 1 0   52 . 67         ST     A1,R8TOAB
45   57 13 2 0  295 . 67         S      A2,(010000)      . CORRECT FINE FREQ. FOR CENTER
45   60 13 2 0   55 . 67         S      A2,R8FFSTOR      . SUBTRACT CORRECTION FACTOR FOR FF
45   61  3 2 0    1              TLZ    A2               . IS IT NEGATIVE?
45   62  5 0 0   65 . 45         J      R8HLAB10         . NO, POSITIVE
45   63 16 2 0  215 . 67         N      A2,(01777777)    . YES, NEGATIVE
45   64 12 2 0  202 . 67         A      A2,(1)
                        R8HLAB10
45   65 13 2 0   54 . 67         S      A2,R8FFERR2
45   66  3 2 0    1              TLEZ   A2               . IS FINE FREQ. LESS THAN MAX ERROR
45   67  5 0 0   37 . 45         J      R8HLAB6          . NO, NOT GOOD, GET NEXT PULSE
                        R8HLAB11                          . YES, CHECK TOA
45   70 10 1 0   52 . 67         LD     A1,R8TOAB
45   71 13 1 0   51 . 67         S      A1,R8TOAA
45   72 13 1 0   35 . 67         S      A1,R8SHORT
45   73  3 1 0    4              TGZ    A1               . IS DIFFERENCE GREATER THAN SHORT CONSTANT
45   74  5 0 0   37 . 45         J      R8HLAB6          . NO, GET NEW B PULSE
45   75 10 1 0   52 . 67         LD     A1,R8TOAB        . YES, CHECK LONG CONSTANT
45   76 13 1 0   51 . 67         S      A1,R8TOAA
```

```
45   77 13 1 0  36 + 67               S       A1,R8LONG
45  100  3 1 0   1                    TLEZ    A1           . IS DIFFERENCE LESS THAN LONG CONSTANT
45  101  5 0 0 154 + 45               J       R8HLAB18     . NO
                                                           . YES
                             R8HLAB13
45  102 10 1 0  51 + 67               LD      A1,R8TOAA
45  103 10 5 0  40 + 67               LD      IX,R8TRNTOA  . EXCEPTABLE TOA
45  104 11 1 1  56 + 67               ST,     A1,R8TRAIN   . PUT IN TOA TRAIN LIST
45  105 13 5 0 201 + 67               S       IX,(2)
45  106  3 5 0   2                    TEZ     IX           . ARE THERE THREE TOAS
45  107  5 0 0 144 + 45               J       R8HLAB16     . NO
45  110 10 1 0  52 + 67               LD      A1,R8TOAB    . YES
45  111 10 5 0  40 + 67               LD      IX,R8TRNTOA
45  112 12 5 0 202 + 67               A       IX,(1)
45  113 11 1 1  56 + 67               ST,     A1,R8TRAIN   . HAVE A COMPLETE TRAIN
                             R8HLAB14
45  114 10 4 0 210 + 67               LD      M0,(3)
45  115 10 1 0 203 + 67               LD      A1,(0)
45  116 11 1 0  62 + 67               ST      A1,R8TEMP
                             R8HLAB15
45  117 10 5 0  62 + 67               LD      IX,R8TEMP
45  120 10 0 1  56 + 67               LD,     A0,R8TRAIN
45  121 12 5 0 202 + 67               A       IX,(1)
45  122 11 5 0  62 + 67               ST      IX,R8TEMP    . STORE FOR TOAS IN TABLE OF TOAS
45  123 10 5 0  45 + 67               LD      IX,R8CNTTOA
45  124 11 0 1  61 + 67               ST,     A0,R8TOAS
45  125 12 5 0 202 + 67               A       IX,(1)
45  126 11 5 0  45 + 67               ST      IX,R8CNTTOA
45  127  4 4 0  10                    JC      M0,$-R8HLAB15
45  130 10 5 0  30 + 67               LD      IX,R8DWNUM
45  131 10 1 1  21 + 67               LD,     A1,R8STGLV
45  132 10 0 0  41 + 67               LD      A0,R8NUMTRN
45  133 12 0 0 202 + 67               A       A0,(1)
45  134 11 0 0  41 + 67               ST      A0,R8NUMTRN
45  135 13 1 0  41 + 67               S       A1,R8NUMTRN
45  136  3 1 0   4                    TGZ     A1           . HAVE ALL TRAINS BEEN FOUND?
45  137  5 0 0 173 + 45               J       R8GOOD       . YES
45  140 10 0 0  42 + 67               LD      A0,R8PULSE   . NO.
45  141 12 0 0 202 + 67               A       A0,(1)
45  142 11 0 0  43 + 67               ST      A0,R8COUNT
45  143 10 1 0 203 + 67               LD      A1,(0)
45  144 11 1 0  40 + 67               ST      A1,R8TRNTOA
45  145  5 0 0  11 + 45               J       R8HLAB3
                             R8HLAB16
45  146 10 1 0  52 + 67               LD      A1,R8TOAB
45  147 11 1 0  51 + 67               ST      A1,R8TOAA
45  150 10 0 0  40 + 67               LD      A0,R8TRNTOA
45  151 12 0 0 202 + 67               A       A0,(1)
45  152 11 0 0  40 + 67               ST      A0,R8TRNTOA
45  153  5 0 0  37 + 45               J       R8HLAB6
                             R8HLAB18
45  154 10 0 0  40 + 67               LD      A0,R8TRNTOA
45  155 13 0 0 210 + 67               S       A0,(3)
45  156  3 0 0   1                    TLZ     A0           . ARE THERE 4 TOAS FOR TRAIN
45  157  5 0 0 114 + 45               J       R8HLAB14     . YES
45  160 10 0 0  42 + 67               LD      A0,R8PULSE   . NO, NOT 4 TOAS
45  161 12 0 0 202 + 67               A       A0,(1)       . NEXT PULSE AFTER START
45  162 11 0 0  43 + 67               ST      A0,R8COUNT
45  163 10 5 0 210 + 67               LD      IX,(3)
45  164 10 1 0 203 + 67               LD      A1,(0)
45  165 11 1 1  56 + 67      R8HLAB19 ST,     A1,R8TRAIN
45  166  4 5 0   1                    JC      IX,$-R8HLAB19
45  167 11 1 0  40 + 67               ST      A1,R8TRNTOA
45  170  5 0 0  11 + 45               J       R8HLAB3      . GET NEW TOA 'A', START NEW TRAIN
                             R8HFAIL
45  171 10 0 0 204 + 67               LD      A0,(-1)
45  172  5 0 0 174 + 45               J       R8RT
                             R8GOOD
45  173 10 0 0 202 + 67               LD      A0,(1)
                             R8RT     RETL    R8CHKPLX
45  174 10 4 0  13 + 67
                             . ************************************R8CHKD      ****************
45  175                      $(R8CBN2)
67                                    LIT     R8DBN1
                             R8CHKDF  ENTL    R8CHKDFX,R8DBN1,R8CBN2
67   14
67   14
45  175
45  175 11 5 0  14 + 67
                             R8HLAB20
45  176 10 5 0  30 + 67               LD      IX,R8DWNUM
45  177 10 1 1  21 + 67               LD,     A1,R8STGLV
45  200 13 1 0 202 + 67               S       A1,(1)
45  201  2 1 1   2                    SLL     A1,2         . (STAGGER LEVEL-1) * 4 IS LAST TRAIN
45  202 11 1 0 103 + 67               ST      A1,R8INDEX
45  203 10 1 0 203 + 67               LD      A1,(0)       . INITIALIZE PARAMETERS
45  204 11 1 0 104 + 67               ST      A1,R8DIFCNT
45  205  3 5 0   2                    TEZ     IX           . FIRST DWELL?
45  206  5 0 0 266 + 45               J       R8HLAB40     . NO, PROCESS DIFFERENTLY SECOND DWELL
45  207 10 1 0 203 + 67               LD      A1,(0)       . YES
45  210 11 1 0 111 + 67               ST      A1,R8DIFLNG
45  211 10 5 0 103 + 67               LD      IX,R8INDEX   . YES
45  212  3 5 0   5                    TNZ     IX           . IS THERE MORE THAN ONE TRAIN?
45  213  5 0 0 243 + 45               J       R8HLAB24     . NO, ONLY ONE TRAIN
                             R8LOOP                        . YES
45  214 10 1 1  66 + 67               LD,     A1,R8TOA4
45  215 11 1 0 115 + 67               ST      A1,R8SAVE1
45  216 13 5 0 207 + 67               S       IX,(4)
45  217 13 1 1  66 + 67               S,      A1,R8TOA4
45  220 11 5 0  62 + 67               ST      IX,R8TEMP
45  221 10 5 0 104 + 67               LD      IX,R8DIFCNT
45  222 11 1 1 105 + 67               ST,     A1,R8DIF     . GET DIFFERENCE BETWEEN TOA'S
45  223 13 1 0 127 + 67               S       A1,R8CYDLT
45  224  3 1 0   1                    TLEZ    A1           . IS DIFFERENCE < CYCLE TIME
45  225  5 0 0 351 + 45               J       R8LABF       . NO, FAILED SYNC
45  226 10 1 1 105 + 67               LD,     A1,R8DIF     . YES, CONTINUE
45  227 13 1 0 111 + 67               S       A1,R8DIFLNG  . FIND LONGEST DIFFERENCE
45  230  3 1 0   4                    TGZ     A1           . IS THIS DIFFERENCE LARGER THAN LAST
45  231  5 0 0 236 + 45               J       R8HLAB21     . NO
45  232 10 0 1 105 + 67               LD,     A0,R8DIF     . YES, SAVE AS LONGEST
45  233 11 0 0 111 + 67               ST      A0,R8DIFLNG
45  234 10 0 0 115 + 67               LD      A0,R8SAVE1
45  235 11 0 0 116 + 67               ST      A0,R8TSAVE
                             R8HLAB21
45  236 12 5 0 202 + 67               A       IX,(1)
45  237 11 5 0 104 + 67               ST      IX,R8DIFCNT
45  240 10 5 0  62 + 67               LD      IX,R8TEMP
45  241  3 5 0   2                    TEZ     IX           . IS INDEX EQUAL TO ZERO
45  242  5 0 0 214 + 45               J       R8LOOP       . NO
                             R8HLAB24                      . YES, FIRST TRAIN
45  243 10 1 1  66 + 67               LD,     A1,R8TOA4
45  244 11 1 0 115 + 67               ST      A1,R8SAVE1
45  245 10 5 0 103 + 67               LD      IX,R8INDEX
45  246 13 1 1  65 + 67               S,      A1,R8TOA3
45  247 11 5 0  62 + 67               ST      IX,R8TEMP
45  250 10 5 0 104 + 67               LD      IX,R8DIFCNT
45  251 11 1 1 105 + 67               ST,     A1,R8DIF
45  252 13 1 0 127 + 67               S       A1,R8CYDLT
45  253  3 1 0   1                    TLEZ    A1           . IS DIFFERENCE < CYCLE TIME
45  254  5 0 0 351 + 45               J       R8LABF       . NO, FAILED SYNC
45  255 10 1 1 105 + 67               LD,     A1,R8DIF     . YES
45  256 13 1 0 111 + 67               S       A1,R8DIFLNG
45  257  3 1 0   4                    TGZ     A1           . IS TOA DIFFERENCE LARGER THAN LAST
45  260  5 0 0 351 + 45               J       R8LABG
45  261 10 0 1 105 + 67               LD,     A0,R8DIF     . YES, SAVE AS LONGEST
45  262 11 0 0 111 + 67               ST      A0,R8DIFLNG
45  263 10 0 0 115 + 67               LD      A0,R8SAVE1
45  264 11 0 0 116 + 67               ST      A0,R8TSAVE
45  265  5 0 0 351 + 45               J       R8LABG
                             R8HLAB40                      . SECOND DWELL
45  266 10 0 0 221 + 67               LD      A0,(077777)  . DIFFERENCE BETWEEN TOAS
45  267 11 0 0 112 + 67               ST      A0,R8DIFSRT
45  270 10 5 0 203 + 67               LD      IX,(0)
45  271 10 1 0  64 + 67               LD      A1,R8TOA2
45  272 10 5 0 103 + 67               LD      IX,R8INDEX
```

```
45  273 13 1 1  61 + 67              S,        A1,R8TOA1
45  274 11 5 0  62 + 67              ST        IX,R8TEMP
45  275 10 5 0 104 + 67              LD        IX,R8DIFCNT
45  276 11 1 1 105 + 67              ST,       A1,R8DIF        . GET FIRST DIFFERENCE
45  277 13 1 0 127 + 67               S        A1,R8CYDLT
45  300  3 1 0   1                   TLEZ      A1              . IS DIFFERENCE < CYCLE TIME
45  301  5 0 0 351 + 45              J          R8LABF         . NO, FAILED SYNC
45  302 10 1 1 105 + 67              LD,       A1,R8DIF        . YES, CONTINUE
45  303 13 1 0 112 + 67              S         A1,R8DIFSRT     . FIND SHORTEST DIFFERENCE
45  304  3 1 0   1                   TLZ       A1              . IS THIS SHORTER THAN LAST
45  305  5 0 0 313 + 45              J         R8HLAB41        . NO
45  306 10 0 1 105 + 67              LD,       A0,R8DIF        . YES, SAVE
45  307 11 0 0 112 + 67              ST        A0,R8DIFSRT
45  310 10 5 0  62 + 67              LD        IX,R8TEMP
45  311 10 0 1  61 + 67              LD,       A0,R8TOA1
45  312 11 0 0 116 + 67              ST        A0,R8TSAVE
                           R8HLAB41 .
45  313 10 5 0 104 + 67              LD        IX,R8DIFCNT     . INCREMENT DIFFENCE COUNTER
45  314 12 5 0 202 + 67              A         IX,(1)
45  315 11 5 0 104 + 67              ST        IX,R8DIFCNT
45  316 10 5 0  62 + 67              LD        IX,R8TEMP
45  317  3 5 0   5                   TNZ       IX              . DOES ONLY ONE TRAIN EXIST ?
45  320  5 0 0 351 + 45              J          R8LABG
                           R8HLOOP1                            . NO, CONTINUE
45  321 10 1 1  61 + 67              LD,       A1,R8TOA1
45  322 13 5 0 207 + 67              S         IX,(4)
45  323 13 1 1  63 + 67              S,        A1,R8TOA1
45  324 11 5 0  62 + 67              ST        IX,R8TEMP
45  325 10 5 0 104 + 67              LD        IX,R8DIFCNT
45  326 11 1 1 105 + 67              ST,       A1,R8DIF
45  327 13 1 0 127 + 67               S        A1,R8CYDLT
45  330  3 1 0   1                   TLEZ      A1              . IS DIFFERENCE < CYCLE TIME
45  331  5 0 0 353 + 45              J          R8LABF         . NO, FAILED SYNC
45  332 10 1 1 105 + 67              LD,       A1,R8DIF        . YES, CONTINUE
45  333 13 1 0 112 + 67              S         A1,R8DIFSRT
45  334  3 1 0   1                   TLZ       A1              . IS DIFFERENCE SHORTER THA  AS
45  335  5 0 0 343 + 45              J         R8HLAB42        . NO
45  336 10 0 1 105 + 67              LD,       A0,R8DIF        . YES, SAVE AS SHORTEST
45  337 11 0 0 112 + 67              ST        A0,R8DIFSRT
45  340 10 5 0  62 + 67              LD        IX,R8TEMP
45  341 10 0 1  61 + 67              LD,       A0,R8TOA1
45  342 11 0 0 116 + 67              ST        A0,R8TSAVE      . SAVE TOA VALUE
                           R8HLAB42
45  343 10 5 0 104 + 67              LD        IX,R8DIFCNT     . INCREMENT DIFFERENCE COUNT.
45  344 12 5 0 202 + 67              A         IX,(1)
45  345 11 5 0 104 + 67              ST        IX,R8DIFCNT
45  346 10 5 0  62 + 67              LD        IX,R8TEMP
45  347  3 5 0   2                   TEZ       IX              . WAS THIS LAST TRAIN
45  350  5 0 0 321 + 45              J         R8HLOOP1        . NO, CONTINUE LOOP
                           R8LABG
45  351 10 0 0 202 + 67               LD        A0,(1)
45  352 10 6 0  14 + 67               RETL      R8CHKDFX
                           R8LABF
45  353 10 0 0 206 + 67               LD'       A0,(-1)
45  354 10 6 0  14 + 67               RETL      .R8CHKDFX

                                                               . RESET COUNTER TO LWA + 4
                           UIBRSET*  ENTG      UIBRSETX,UIDBN,UICBN
61    6
61    6
 0  134
 0  134 10 3 0  62 + 61              LD        A3,UIDBA
 0  135  1 3 0   0                   XB        A3              . SET BR TO DATA BLOCK
 0  136 10 1 0 127 + 61              LD        A1,UIBACTRC     . MAJOR/MINOR CODE-BUFFER MEMORY/COUNTER 021002
 0  137  7 1 0  41                   O         A1,041          . VIDIO PROCESSOR/SET MAJOR-MINOR
 0  140 10 3 0   0 + 60              LD        A3,GLOBBA
 0  141  1 3 0   0                   XB        A3
 0  142 10 0 0  17 + 60              LD        A0,LWA          . LAST WORD ADDRESS
 0  143  1 3 0   0                   XB        A3
 0  144 12 0 0 337 + 61              A         A0,(4)
 0  145 11 0 0 132 + 61              ST        A0,UITEMP       . BUFFER ADDRESS COUNTER = LWA + 4
 0  146 13 0 0 130 + 61              S         A0,UIBUFSIZ
 0  147  3 0 0   6                   TGEZ      A0              . COUNTER .GE. BUFFER MAX VALUE?
 0  150 10 0 0 132 + 61              LD        A0,UITEMP       . NO
 0  151  7 0 0  44                   O         A0,044          . YES, COUNTER = COUNTER-MAX. VALUE
                                     RETG      UIBRSETX        . RETURN TO CALLING PROGRAM
 0  152 10 5 0   1 + 60
 0  153  1 5 0   0
 0  154 10 5 0   7 + 61
 0  155 10 6 0  66 + 61


                                                               . UIBPULS - PULSE NUMBER IN A0 RETURN ARGU.
                                                               .           TOA IN A1
                                                               .           FF  IN A2
                           UIBPULS*  ENTG      UIBPULSX,UIDBN,UICBN        AMPL IN A3
61   20
61   20
 0  300

 0  300 10 3 0  62 + 61              LD        A3,UIDBA
 0  301  1 3 0   0                   XB        A3              . SET BR TO DATA BLOCK
 0  302  3 0 0   6                   TGEZ      A0              . ILLEGAL PULSE NUMBER
 0  303  5 0 0 345 +  0              J         UIPLSRTN        . YES, RETURN
 0  304  2 0  1  2                   SLL       A0,2            . PULSE NUMBER + 4
 0  305 11 0 0 133 + 61              ST        A0,UIARG        . LOCATION NUMBER
 0  306 10 3 0   0 + 60              LD        A3,GLOBBA
 0  307  1 3 0   0                   XB        A3
 0  310 10 1 0  17 + 60              LD        A1,LWA          . LAST WORD ADDRESS
 0  311  1 3 0   0                   XB        A3
 0  312 12 1 0 337 + 61              A         A1,(4)
 0  313 11 1 0 132 + 61              ST        A1,UITEMP
 0  314 10 1 0 127 + 61              LD        A1,UIBACTRC     . MAJOR/MINOR CODE - BUFFER MEMORY/COUNTER
 0  315  7 1 0  41                   O         A1,041          . VIDIO PROCESSOR/SET MAJOR-MINOR
 0  316  6 1 0 244                   I         A1,0244         . READ BUFFER ADDRESS COUNTER
 0  317  2 1  3  2                   SLL       A1,4
 0  320  2 1  3  1                   SRL       A1,4
 0  321 13 1 0 132 + 61              S         A1,UITEMP       . BUFFER COUNTER - (LWA + 4)
 0  322  3 1 0   6                   TGEZ      A1              . LENGTH NEGATIVE?
 0  323 12 1 0 130 + 61              A         A1,UIBUFSIZ     . YES, ADD IN BUFFER SIZE
 0  324 13 1 0 133 + 61              S         A1,UIARG
 0  325  3 1 0   6                   TGEZ      A1              . LENGTH NEGATIVE?
 0  326  5 0 0 345 +  0              J         UIPLSRTN        . YES, RETURN
 0  327 10 5 0 133 + 61              LD        IX,UIARG
 0  330 12 5 0 132 + 61              A         IX,UITEMP       . ADDR = LWA + 4 + PULSE NUMBER*4
 0  331 13 5 0 130 + 61              S         IX,UIBUFSIZ
 0  332  3 5 0   6                   TGEZ      IX              . ADDR .GE. BUFFER MAX. VALUE
 0  333 12 5 0 130 + 61              A         IX,UIBUFSIZ     . NO, ADD BUFFER SIZE
 0  334 12 5 0 343 + 61              A         IX,(0100000)    . STARTING ADDRESS OF BUFFER MEMORY
 0  335 10 0 0 324 + 61              LD        A0,(0)
 0  336  1 0 0   0                   XB        A0
 0  337 10 1 1   1                   LD,       A1,1            . TOA
 0  340 10 2 1   2                   LD,       A2,2            . FINE FREQ
 0  341 10 3 1   3                   LD,       A3,3            . AMPLITUDE
 0  342  1 0 0   0                   XB        A0
 0  343 10 0 0 133 + 61              LD        A0,UIARG        . LOCATION NUMBER
 0  344  2 0  1  1                   SRL       A0,2            . PULSE NUMBER
                           UIPLSRTN  RETG      UIBPULSX        . RETURN TO CALLING PROGRAM
 0  345 10 5 0   1 + 60
 0  346  1 5 0   0
 0  347 10 5 0  21 + 61
 0  350 10 6 0  66 + 61
```

We claim:

1. A processing system for determining the phase coherency of propagating signals having characteristics of frequency, amplitude, pulse repetition interval and stagger level, said system comprising:

means for establishing predetermined periods of time;

means for segregating a first and second group of pulses from said propagating signals during each predetermined time period based on predetermined characteristics including frequency and amplitude; and means for processing said first and second groups of pulses associated with each predetermined time period in accordance with a function based on predetermined characteristics including pulse repetition interval and stagger level, respectively associated with each group of pulses, to establish the relative phase of said first group with respect to said second group of pulses for each time period and for comparing the relative phases, established for each time period, to determine the phase coherency of said first and second groups of pulses.

2. A processing system according to claim 1 wherein the first and second groups of pulses are respectively segregated from first and second propagating signals for the purposes of determining the phase coherency of said first and second propagating signals.

3. A processing system according to claim 1 wherein each predetermined time period includes a first and second dwell time; and wherein the first group of pulses are segregated from the propagating signals during said first dwell time and said second group of pulses are segregated from the propagating signals during said second dwell time.

4. A processing system according to claim 3 wherein the first and second groups of pulses are comprised of pulse trains having pulse repetition intervals associated therewith; and wherein the processing means establishes the relative phase between the first and second groups of pulses by finding the phase difference of the end pulse of the longest pulse repetition interval of the pulse trains of the first dwell time and the beginning pulse of the shortest pulse repetition interval of the pulse trains of the second dwell time.

5. A processing system according to claim 1 wherein the predetermined time periods are sequentially established separated from each other by predetermined time delays such that each processing and phase comparison operation for determining phase coherency is sequentially separated from another equivalent operation by said predetermined time delay.

6. A method of determining the phase coherency of at least two propagating signals having the characteristics of frequency, amplitude, pulse repetition interval and stagger level, said method comprising the steps of:

establishing predetermined periods of time;

segregating a group of pulses from each of the at least two propagating signals during each predetermined time period based on predetermined characteristics including frequency and amplitude;

processing the groups of pulses, segregated during each time period, in accordance with a function based substantially on predetermined characteristics of pulse repetition interval and stagger level, respectively corresponding to each group of pulses, to determine the relative phase between the groups of pulses for each time period; and comparing the relative phases, determined for each time period, to determine the phase coherency of the at least two propagating signals.

7. A method in accordance with claim 6 wherein the steps of establishing predetermined periods of time includes the step of sequentially separating the periods of time from each other by a predetermined time delay, and wherein further the steps of segregating, processing and comparing are sequentially conducted after each predetermined time delay.

8. A method in accordance with claim 6 including the steps of:

establishing a dwell time for each of the at least two propagating signals within each established period of time; and segregating the group of pulses from each of the at least two propagating signals as defined by said dwell time correspondingly associated with each propagating signal.

9. A method in accordance with claim 8 wherein the processing step further includes the step of finding the phase difference of an end pulse of the longest pulse repetition interval of pulse trains of the group of pulses associated with one dwell time and the beginning pulse of the shortest pulse repetition interval of pulse trains of the group of pulses associated with another dwell time, whereby said phase difference being the relative phase between the one and another groups of pulses and propagating signals associated therewith.

10. Apparatus for preprocessing at least two propagating signals to determine a phase angle difference therebetween and for identifying if said phase angle difference is changing with time, said apparatus comprising:

first means for detecting at least two propagating signals having the characteristics of frequency, amplitude, pulse repetition interval and stagger level and for forming a group of pulses from each of said propagating signals in accordance with a set of values of characteristics including a predetermined threshold amplitude, a predetermined frequency and a dwell time respectively associated with each group of pulses;

second means for storing selected characteristics of said formed groups of pulses including time of arrival, frequency and amplitude characteristics;

third means coupled to said first and second means, for controlling the sequencing of operation of said first and second means and for processing the selected characteristics stored in the second means in accordance with a function based on predetermined values of pulse repetition interval and stagger level, corresponding to each group of pulses formed by said first means, to determine the phase angle difference between said at least two propagating signals.

11. Apparatus in accordance with claim 10 wherein the first means includes a receiver for detecting the at least two propagating signals; a set of registers, coupled between said receiver and said third means, for storing said set of values during the formation of each group of pulses; and a dwell counter, coupled to said receiver and said third means, for establishing the dwell time associated with the formation of each group of pulses.

12. Apparatus in accordance with claim 11 wherein the second means includes a buffer memory, coupled between said receiver and third means, for storing said selected characteristics; and a buffer memory controller, coupled to the receiver, buffer memory and third means, for selecting the characteristics to be stored from the detected signals of the receiver under the direction of the third means.

13. Apparatus in accordance with claim 10 wherein the third means comprises a programmed digital computer including a central processing unit and a central processing memory coupled thereto, said central processing memory being preprogrammed with operational and processing instructions which are sequentially processed by said central processing unit in accordance with predetermined time periods for performing the functions of the third means.

* * * * *